(12) United States Patent
Gschwind et al.

(10) Patent No.: US 10,740,067 B2
(45) Date of Patent: Aug. 11, 2020

(54) SELECTIVE UPDATING OF FLOATING POINT CONTROLS

(71) Applicant: INTERNATIONAL BUSINESS MACHINES CORPORATION, Armonk, NY (US)

(72) Inventors: Michael K. Gschwind, Chappaqua, NY (US); Valentina Salapura, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 67 days.

(21) Appl. No.: 15/631,061

(22) Filed: Jun. 23, 2017

(65) Prior Publication Data

US 2018/0373496 A1     Dec. 27, 2018

(51) Int. Cl.
| | | |
|---|---|---|
| *G06F 7/483* | (2006.01) | |
| *H03M 7/24* | (2006.01) | |
| *G06F 9/30* | (2018.01) | |
| *G06F 9/38* | (2018.01) | |

(52) U.S. Cl.
CPC .......... *G06F 7/483* (2013.01); *G06F 9/30014* (2013.01); *G06F 9/30076* (2013.01); *G06F 9/30087* (2013.01); *G06F 9/30101* (2013.01); *G06F 9/30189* (2013.01); *G06F 9/3836* (2013.01); *H03M 7/24* (2013.01)

(58) Field of Classification Search
None
See application file for complete search history.

(56) References Cited

U.S. PATENT DOCUMENTS

| | | | |
|---|---|---|---|
| 5,812,439 A | 9/1998 | Hansen | |
| 5,826,070 A * | 10/1998 | Olson | G06F 9/30094 712/222 |
| 5,828,873 A | 10/1998 | Lynch | |
| 6,151,669 A | 11/2000 | Huck | |
| 6,513,109 B1 | 1/2003 | Gschwind | |
| 6,560,774 B1 | 5/2003 | Gordon | |
| 6,578,059 B1 | 6/2003 | Huck et al. | |
| 6,779,103 B1 * | 8/2004 | Alexander, III | G06F 9/30101 712/217 |
| 6,810,476 B2 | 10/2004 | McGrath et al. | |
| 7,373,489 B1 | 5/2008 | Brooks et al. | |
| 7,529,912 B2 | 5/2009 | Henry et al. | |

(Continued)

OTHER PUBLICATIONS

Gschwind, Michael K. et al., "Read and Set Floating Point Control Register Instruction," U.S. Appl. No. 15/812,499, filed Nov. 14, 2017, pp. 1-88.

(Continued)

*Primary Examiner* — William B Partridge
(74) *Attorney, Agent, or Firm* — Steven Chiu, Esq.; Blanche E. Schiller, Esq.; Heslin Rothenberg Farley Mesiti P.C.

(57) ABSTRACT

Setting or updating of floating point controls is managed. Floating point controls include controls used for floating point operations, such as rounding mode and/or other controls. Further, floating point controls include status associated with floating point operations, such as floating point exceptions and/or others. The management of the floating point controls includes efficiently updating the controls, while reducing costs associated therewith.

20 Claims, 28 Drawing Sheets

THE SELECTED LOCATION INCLUDES A FLOATING POINT CONTROL REGISTER — 2020

THE OBTAINING THE REQUEST INCLUDES OBTAINING AN INSTRUCTION THAT INDICATES SETTING OF THE FLOATING POINT CONTROL — 2022

THE INSTRUCTION INCLUDES, E.G., A FIELD USED TO OBTAIN A VALUE TO BE USED TO SET THE FLOATING POINT CONTROL — 2024

THE INSTRUCTION FURTHER INCLUDES, E.G., ANOTHER FIELD USED TO OBTAIN A CURRENT VALUE OF THE FLOATING POINT CONTROL — 2026

THE FLOATING POINT CONTROL INCLUDES, E.G., A ROUNDING MODE — 2028

THE FLOATING POINT CONTROL INCLUDES, E.G., A FLOATING POINT EXCEPTION — 2030

(56) References Cited

U.S. PATENT DOCUMENTS

| | | |
|---|---|---|
| 7,546,328 B2 | 6/2009 | Schulte et al. |
| 7,725,519 B2 | 5/2010 | Dockser |
| 7,840,788 B1 | 11/2010 | Rozas et al. |
| 7,895,418 B1 | 2/2011 | Green |
| 7,908,460 B2 | 3/2011 | Liao et al. |
| 7,996,662 B2 | 8/2011 | Lien et al. |
| 8,095,777 B2 | 1/2012 | Blaner et al. |
| 8,229,989 B2 | 7/2012 | Dhong et al. |
| 8,412,761 B2 | 4/2013 | Yoshida |
| 8,539,451 B2 | 9/2013 | Ivancic |
| 8,782,625 B2 | 7/2014 | Godefroid |
| 8,788,792 B2 | 7/2014 | Yates |
| 8,799,344 B2 * | 8/2014 | Steele, Jr. ............... G06F 5/012 708/495 |
| 8,949,580 B2 | 2/2015 | Li |
| 9,009,208 B2 | 4/2015 | Nystad |
| 9,047,314 B1 | 6/2015 | Luetkemeyer |
| 9,189,200 B1 | 11/2015 | Langhammer |
| 9,201,651 B2 | 12/2015 | Craske |
| 9,459,875 B2 | 10/2016 | Bradbury |
| 9,529,574 B2 | 12/2016 | Gonion |
| 9,594,576 B2 | 3/2017 | Gainey, Jr. |
| 9,710,280 B2 | 7/2017 | Chung |
| 9,760,376 B1 | 9/2017 | Bequet |
| 9,766,864 B2 | 9/2017 | Rempell |
| 9,851,946 B2 | 12/2017 | Cowlishaw |
| 9,898,297 B2 | 2/2018 | Vorbach |
| 9,921,848 B2 | 3/2018 | Bradbury |
| 9,977,729 B1 | 5/2018 | Ivancic |
| 2003/0005013 A1 | 1/2003 | Steele, Jr. |
| 2003/0028759 A1 | 2/2003 | Prabhu et al. |
| 2004/0093319 A1 | 5/2004 | Ogasawara |
| 2005/0033946 A1 * | 2/2005 | Abadallah ........... G06F 9/30101 712/235 |
| 2005/0257202 A1 | 11/2005 | Kaestner |
| 2007/0055723 A1 | 3/2007 | Cornea-Hasegan |
| 2007/0067759 A1 | 3/2007 | Uchida |
| 2007/0113060 A1 | 5/2007 | Lien |
| 2008/0244241 A1 | 10/2008 | Barraclough |
| 2009/0172355 A1 | 7/2009 | Anderson |
| 2011/0004644 A1 | 1/2011 | Henry |
| 2013/0086365 A1 | 4/2013 | Gschwind |
| 2013/0326199 A1 | 12/2013 | Magklis et al. |
| 2014/0095833 A1 | 4/2014 | Gschwind et al. |
| 2014/0281419 A1 | 9/2014 | Lupon et al. |
| 2015/0088946 A1 | 3/2015 | Anderson et al. |
| 2015/0121044 A1 | 4/2015 | Lau |
| 2015/0277880 A1 | 10/2015 | Gschwind |
| 2015/0286482 A1 | 10/2015 | Espasa et al. |
| 2015/0347108 A1 | 12/2015 | Munshi et al. |
| 2016/0062954 A1 | 3/2016 | Ruff et al. |
| 2016/0070538 A1 | 3/2016 | Cowlishaw et al. |
| 2016/0139881 A1 | 5/2016 | Draese et al. |
| 2016/0139918 A1 | 5/2016 | Zohar et al. |
| 2016/0232071 A1 | 8/2016 | Duale et al. |
| 2016/0371496 A1 | 12/2016 | Sell |
| 2017/0090939 A1 | 3/2017 | Gschwind et al. |
| 2017/0090940 A1 | 3/2017 | Gschwind et al. |
| 2018/0088941 A1 * | 3/2018 | Pardo ................. G06F 7/49942 |
| 2018/0173527 A1 | 6/2018 | Moudgill |
| 2018/0373489 A1 | 12/2018 | Gschwind et al. |
| 2018/0373497 A1 | 12/2018 | Gschwind et al. |
| 2018/0373499 A1 | 12/2018 | Gschwind et al. |
| 2018/0373500 A1 | 12/2018 | Gschwind et al. |
| 2018/0373528 A1 | 12/2018 | Gschwind et al. |
| 2018/0373529 A1 | 12/2018 | Gschwind et al. |
| 2018/0373530 A1 | 12/2018 | Gschwind et al. |
| 2018/0373531 A1 | 12/2018 | Gschwind et al. |
| 2018/0373532 A1 | 12/2018 | Gschwind et al. |
| 2018/0373533 A1 | 12/2018 | Gschwind et al. |
| 2018/0373534 A1 | 12/2018 | Gschwind et al. |
| 2018/0373537 A1 | 12/2018 | Gschwind et al. |

OTHER PUBLICATIONS

Gschwind, Michael K. et al., "Employing Prefixes to Control Floating Point Operations," U.S. Appl. No. 15/812,552, filed Nov. 14, 2017, pp. 1-87.

Gschwind, Michael K. et al., "Fine-Grained Management of Exception Enablement of Floating Point Controls," U.S. Appl. No. 15/812,529, filed Nov. 14, 2017, pp. 1-88.

Gschwind, Michael K. et al., "Compiler Controls for Program Regions," U.S. Appl. No. 15/812,515, filed Nov. 14, 2017, pp. 1-88.

Gschwind, Michael K. et al., "Compiler Controls for Program Language Constructs," U.S. Appl. No. 15/816,384, filed Nov. 17, 2017, pp. 1-87.

Gschwind, Michael K. et al., "Predicted Null Updates," U.S. Appl. No. 15/810,604, filed Nov. 13, 2017, pp. 1-88.

List of IBM Patents or Patent Applications Treated as Related, Jan. 26, 2018, pp. 1-2.

Anonymous, "Method for Generating Floating Point Status Word Control Bits," IP.com No. IPCOM000006388D, Dec. 2001, pp. 1-2 (+ cover).

Burgess, Neil, "Prenormalization Rounding in IEEE Floating-Point Operations Using a Flagged Prefix Adder," IEEE Transactions on Very Large Scale Integration(VLSI) Systems, vol. 13, No. 2, Feb. 2005, pp. 266-277.

Ehliar, Andreas, "Area Efficient Floating-Point Adder and Multiplier with IEEE—754 Compatible Semantics," 2014 International Conference on Field Programmable Technology, Dec. 2014, pp. 131-138.

Ganguly, Soumya et al., "A Unified Flagged Prefix Constant Addition-Subtraction Scheme for Design of Area and Power Efficient Binary Floating-Point and Constant Integer Arithmetic Circuits," 2014 IEEE Asia Pacific Conference on Circuits and Systems, Nov. 2014, pp. 69-72.

Mel, Peter and Tim Grance, "The NIST Definition of Cloud Computing," National Institute of Standards and Technology, Information Technology Laboratory, Special Publication 800-145, Sep. 2011, pp. 1-7.

Wang, Liang-Kai et al., "Decimal Floating-Point Adder and Multifunction Unit with Injection-Based Rounding," $18^{th}$ IEEE Symposium on Computer Arithmetic, Jun. 2007, pp. 1-10.

Yoo, Seehwan et al., "Virtualizing ARM VFP (Vector Floating-Point) with Xen-ARM," Journal of Systems Architecture, Oct. 2013, pp. 1266-1276.

Yu, Chi Wai et al., "The Coarse-Grained/Fine-Grained Logic Interface in FPGAS with Embefded Floating-Point Arithmetic Units," 2008 $4^{th}$ Southern Conference on Programmable Logic, Mar. 2008, pp. 63-68.

Gschwind, Michael K. et al., "Compiler Controls for Program Language Constructs," U.S. Appl. No. 15/631,072, filed Jun. 23, 2017, pp. 1-89.

Gschwind, Michael K. et al., "Compiler Controls for Program Regions," U.S. Appl. No. 15/631,080, filed Jun. 23, 2017, pp. 1-92.

Gschwind, Michael K. et al., "Employing Prefixes to Control Floating Point Operations," U.S. Appl. No. 15/631,098, filed Jun. 23, 2017, pp. 1-91.

Gschwind, Michael K. et al., "Fine-Grained Management of Exception Enablement of Floating Point Controls," U.S. Appl. No. 15/631,086, filed Jun. 23, 2017, pp. 1-91.

Gschwind, Michael K. et al., "Predicted Null Updates," U.S. Appl. No. 15/631,052, filed Jun. 23, 2017, pp. 1-92.

Gschwind, Michael K. et al., "Read and Set Floating Point Control Register Instruction," U.S. Appl. No. 15/631,106, filed Jun. 23, 2017, pp. 1-89.

List of IBM Patents or Patent Applications Treated as Related, Jul. 6, 2017, pp. 1-2.

Intel, "Intel 64 and IA-32 Architectures Software Developer's Manual—vol. 1: Basic Architecture," 253665-060US, Sep. 2016, pp. vol. 1 8-1 thru vol. 1 8-34.

International Search Report and Written Opinion for PCT/IP2018/054580 dated Oct. 25, 2018, pp. 1-9.

Nothaft, F. et al., "Pragma-Based Floating-to-Fixed Point Conversion for the Emulation of Analog Behavioral Models," May 2014, pp. 633-640.

(56) References Cited

OTHER PUBLICATIONS

Anderson, A. et al., "Vectorization of Multibyte Floating Point Data Formats," PACT '16, Sep. 2016, pp. 363-372.
Lee, Seyong et al., "OpenARC: Extensible OpenACC Compiler Framework for Directive-Based Accelerator Programming Study," 2014 First Workshop on Accelerator Programming Using Directives, Jan. 2014, pp. 1-11.
IBM, "Power ISA—V2.07B," Apr. 2015, pp. 113-211, 318-320, 349-356, 588, 643-645, 1190-1191, 1352 (+ cover page).
IBM, "z/Architecture—Principles of Operation," IBM Publication No. SA22-7832-10, Eleventh Edition, Mar. 2015, pp. 1-4, 1-8, 1-13, 1-14, 2-4, 2-5, 9-1 thru 9-53, 11-20, 11-23 thru 11-24, 19-1 thru 19-2, 19-5 thru 19-9, 20-7 thru 20-14, 20-41 thru 20-45, 24-1 thru 24-2 (+ cover pages).
Gschwind, Michael K., et al., "Compiler Controls for Program Regions," U.S. Appl. No. 16/398,559, filed Apr. 30, 2019, pp. 1-92.
List of IBM Patents or Patent Applications Treated as Related, Jul. 22, 2019, pp. 1-2.

* cited by examiner

| FP CONTROL PREFIX INDICATOR | FP_exception indicator | FP_exception_indicator_value |

| FP CONTROL PREFIX INDICATOR | FP_exception_control_indicator |

| FP CONTROL PREFIX INDICATOR | FP_exception_field 1 | FP_exception_field 2 | FP_exception_field 3 | ... |

| FP CONTROL PREFIX INDICATOR | X1 | FP_exception_field 1 | X2 | FP_exception_field 2 | X3 | FP_exception_field 3 | ... |

1242 — 1244 — 1246 — 1244 — 1246 — 1244 — 1246

SELECTIVE UPDATING OF FLOATING POINT CONTROLS

BACKGROUND

One or more aspects relate, in general, to processing within a computing environment, and in particular, to facilitating such processing.

Processing within a computing environment includes performing operations, and some of those operations employ arithmetic. There are different types of arithmetic, including, for example, floating point, decimal floating point, binary, and hexadecimal arithmetic, to name a few. Each type of arithmetic uses a specific representation. For instance, floating point arithmetic uses a formulaic representation of real numbers as an approximation to support a trade-off between range and precision. Floating point arithmetic is used by floating point operations.

To manage floating point operations within a computing environment, a floating point control and/or status register is provided. As examples, a floating point control/status register includes floating point controls, such as, for instance, mask bits, flag bits, data exception code and rounding mode fields, to control floating point operations within a computing environment.

Currently, two approaches for managing the floating point controls are used, including updating the floating point control/status register, which requires serialization to be performed to stop processing in order to update the controls; and a floating point control register renaming process which is expensive in implementation.

SUMMARY

Shortcomings of the prior art are overcome and additional advantages are provided through the provision of a computer program product for facilitating processing within a computing environment. The computer program product comprises a storage medium readable by a processing circuit and storing instructions for performing a method. The method includes, for instance, obtaining a request to set a floating point control. Based on obtaining the request, a determination is made as to whether a value of the floating point control indicated by the request is equal to a value of the floating point control stored in a selected location. Based on determining that the value of the floating point control indicated by the request is equal to the value of the floating point control stored in the selected location, the floating point control is used by one or more instructions. The using is prior to a potential setting of the floating point control based on the request. By recognizing a null update, processing may be performed absent serialization, thereby facilitating processing and improving performance.

In one embodiment, based on determining that the value of the floating point control indicated by the request is equal to the value of the floating point control stored in the selected location, serialization of readers of the floating point control is avoided. By avoiding serialization, performance within the computing environment may be enhanced.

Further, in one embodiment, based on determining that the value of the floating point control indicated by the request is equal to the value of the floating point control stored in the selected location, an instruction is executed that uses the floating point control. The executing the instruction is absent serialization of execution of the instruction with respect to updating the floating point control.

In a further embodiment, based on determining that the value of the floating point control indicated by the request is unequal to the value of the floating point control stored in the selected location, serialization of one or more readers of the floating point control is performed.

As an example, the selected location included a floating point control register.

The obtaining the request includes, for instance, obtaining an instruction that indicates setting of the floating point control. As one example, the instruction includes a field used to obtain a value to be used to set the floating point control. In one embodiment, the instruction further includes another field used to obtain a current value of the floating point control.

As one example, the floating point control includes a rounding mode. In another example, the floating point control includes a floating point exception.

Computer-implemented methods and systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIGS. 12A-12D depict other examples of prefix instructions, in accordance with one or more aspects of the present invention;

DETAILED DESCRIPTION

In accordance with one or more aspects, a capability is provided to enhance management of floating point controls. As used herein, floating point controls include controls used for floating point operations, such as rounding mode and/or other controls, and status associated with floating point operations, such as a data exception code, floating point exceptions, and/or others. Other controls and/or status may also be included in floating point controls. These floating point controls may be located in a register, such as a floating point control register (also referred to as a floating point control and status register). This capability includes reducing the serialization currently used to perform an update of the floating point control register and to avoid renaming the floating point control register.

One embodiment of a computing environment to incorporate and use one or more aspects of the present invention is described with reference to FIG. 1A. In one example, the computing environment is based on the z/Architecture, offered by International Business Machines Corporation, Armonk, N.Y. One embodiment of the z/Architecture is described in "z/Architecture Principles of Operation," IBM Publication No. SA22-7832-10, March 2015, which is hereby incorporated herein by reference in its entirety. Z/ARCHITECTURE is a registered trademark of International Business Machines Corporation, Armonk, N.Y., USA.

In another example, the computing environment is based on the Power Architecture, offered by International Business Machines Corporation, Armonk, N.Y. One embodiment of the Power Architecture is described in "Power ISA™ Version 2.07B," International Business Machines Corporation, Apr. 9, 2015, which is hereby incorporated herein by reference in its entirety. POWER ARCHITECTURE is a registered trademark of International Business Machines Corporation, Armonk, N.Y., USA.

The computing environment may also be based on other architectures, including, but not limited to, the Intel x86 architectures. Other examples also exist.

Figure 1A:
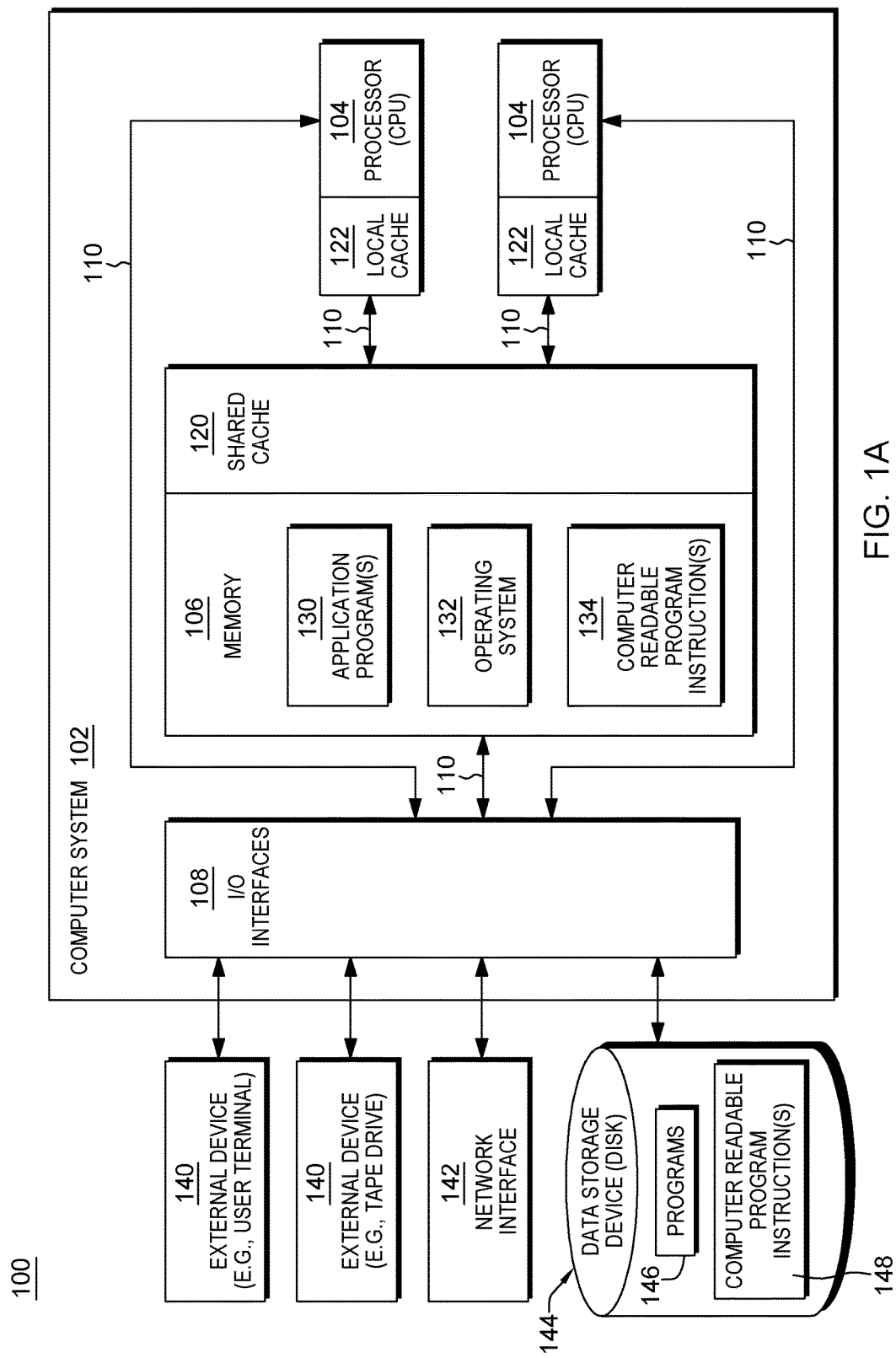
FIG. 1A depicts one example of a computing environment to incorporate and use one or more aspects of the present invention.

As shown in FIG. 1A, a computing environment 100 includes, for instance, a computer system 102 shown, e.g., in the form of a general-purpose computing device. Computer system 102 may include, but is not limited to, one or more processors or processing units 104 (e.g., central processing units (CPUs)), a memory 106 (referred to as main memory or storage, as examples), and one or more input/output (I/O) interfaces 108, coupled to one another via one or more buses and/or other connections 110.

Bus 110 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 106 may include, for instance, a cache 120, such as a shared cache, which may be coupled to local caches 122 of processors 104. Further, memory 106 may include one or more programs or applications 130, an operating system 132, and one or more computer readable program instructions 134. Computer readable program instructions 134 may be configured to carry out functions of embodiments of aspects of the invention.

Computer system 102 may also communicate via, e.g., I/O interfaces 108 with one or more external devices 140, one or more network interfaces 142, and/or one or more data storage devices 144. Example external devices include a user terminal, a tape drive, a pointing device, a display, etc. Network interface 142 enables computer system 102 to communicate with one or more networks, such as a local area network (LAN), a general wide area network (WAN), and/or a public network (e.g., the Internet), providing communication with other computing devices or systems.

Data storage device 144 may store one or more programs 146, one or more computer readable program instructions 148, and/or data, etc. The computer readable program instructions may be configured to carry out functions of embodiments of aspects of the invention.

Computer system 102 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 102. Examples, include, but are not limited to: microcode, device drivers, redundant processing units, external disk drive arrays, RAID systems, tape drives, and data archival storage systems, etc.

Computer system 102 may be operational with numerous other general purpose or special purpose computing system environments or configurations. Examples of well-known computing systems, environments, and/or configurations that may be suitable for use with computer system 102 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Figure 1B:
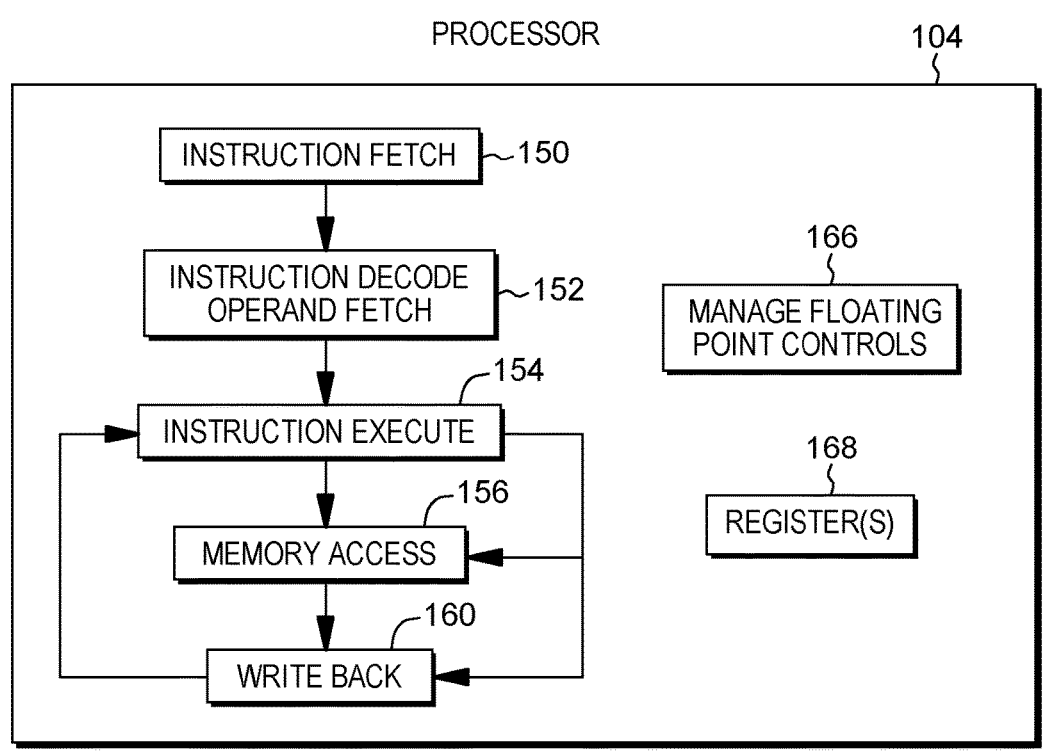
FIG. 1B depicts further details of a processor of FIG. 1A, in accordance with an aspect of the present invention.

Further details regarding one example of processor 104 are described with reference to FIG. 1B. Processor 104 includes a plurality of functional components used to execute instructions. These functional components include, for instance, an instruction fetch component 150 to fetch instructions to be executed; an instruction decode unit 152 to decode the fetched instructions and to obtain operands of the decoded instructions; instruction execution components 154 to execute the decoded instructions; a memory access component 156 to access memory for instruction execution, if necessary; and a write back component 160 to provide the results of the executed instructions. One or more of these components may, in accordance with an aspect of the present invention, be used to execute one or more operations and/or instructions to manage floating point controls 166, and/or other operations/instructions associated therewith.

Processor 104 also includes, in one embodiment, one or more registers 168 to be used by one or more of the functional components. Processor 104 may include additional, fewer and/or other components than the examples provided herein.

Figure 1C:
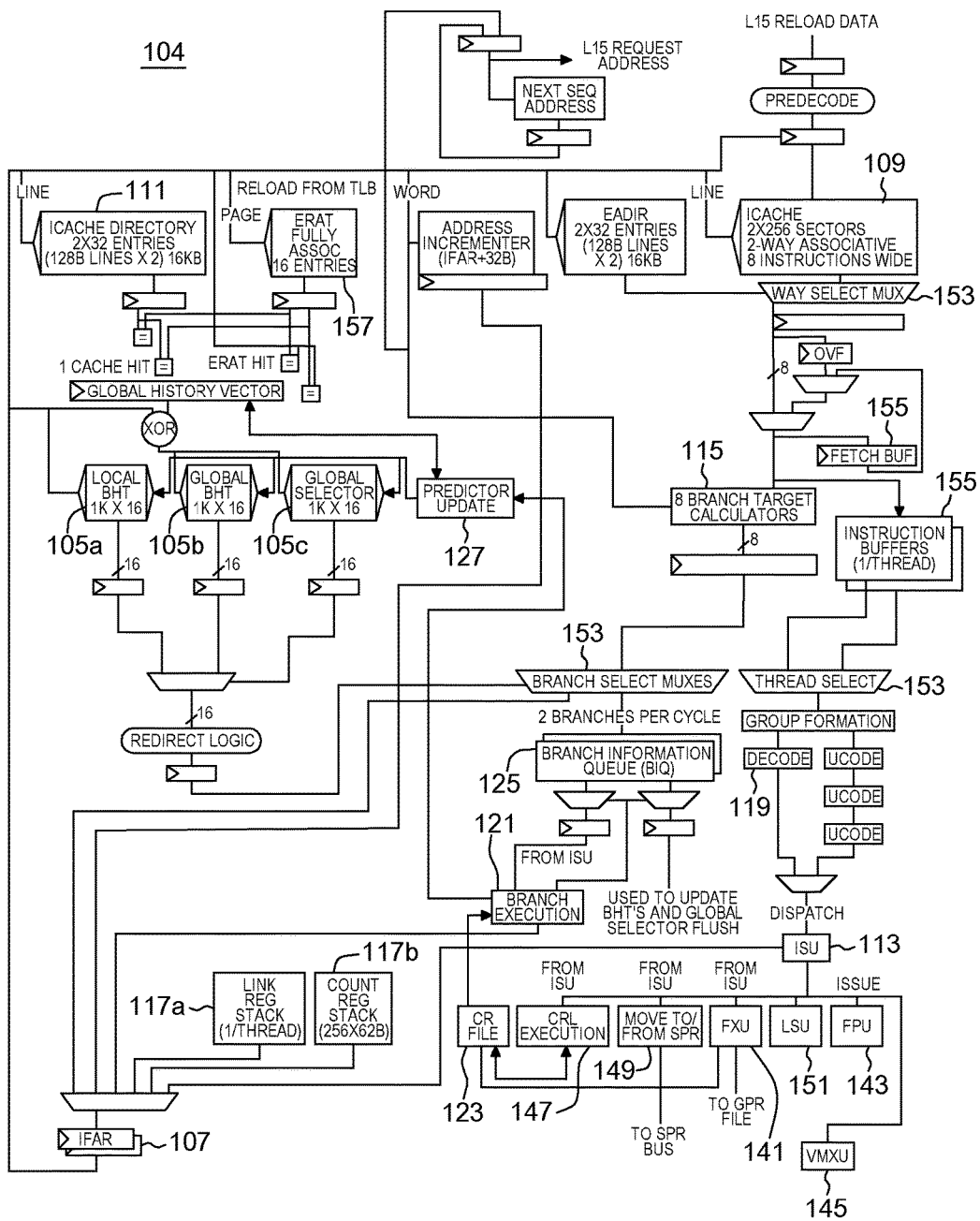
FIG. 1C depicts yet further details of a processor of FIG. 1A, in accordance with an aspect of the present invention.

Additional details regarding a processor are described with reference to FIG. 1C. In one example, a processor, such as processor 104, is a pipelined processor that may include prediction hardware, registers, caches, decoders, an instruction sequencing unit, and instruction execution units, as examples. The prediction hardware includes, for instance, a local branch history table (BHT) 105a, a global branch history table (BHT) 105b, and a global selector 105c. The prediction hardware is accessed through an instruction fetch address register (IFAR) 107, which has the address for the next instruction fetch.

The same address is also provided to an instruction cache 109, which may fetch a plurality of instructions referred to as a "fetch group". Associated with instruction cache 109 is a directory 111.

The cache and prediction hardware are accessed at approximately the same time with the same address. If the prediction hardware has prediction information available for an instruction in the fetch group, that prediction is forwarded to an instruction sequencing unit (ISU) 113, which, in turn, issues instructions to execution units for execution. The prediction may be used to update IFAR 107 in conjunction with branch target calculation 115 and branch target prediction hardware (such as a link register prediction stack 117a and a count register stack 117b). If no prediction information is available, but one or more instruction decoders 119 find a branch instruction in the fetch group, a prediction is created for that fetch group. Predicted branches are stored in the prediction hardware, such as in a branch information queue (BIQ) 125, and forwarded to ISU 113.

A branch execution unit (BRU) 121 operates in response to instructions issued to it by ISU 113. BRU 121 has read access to a condition register (CR) file 123. Branch execution unit 121 further has access to information stored by the branch scan logic in branch information queue 125 to determine the success of a branch prediction, and is operatively coupled to instruction fetch address register(s) (IFAR) 107 corresponding to the one or more threads supported by the microprocessor. In accordance with at least one embodiment, BIQ entries are associated with, and identified by an identifier, e.g., by a branch tag, BTAG. When a branch associated with a BIQ entry is completed, it is so marked. BIQ entries are maintained in a queue, and the oldest queue entry (entries) is (are) de-allocated sequentially when it is marked as containing information associated with a completed branch. BRU 121 is further operatively coupled to cause a predictor update when BRU 121 discovers a branch misprediction.

When the instruction is executed, BRU 121 detects if the prediction is wrong. If so, the prediction is to be updated. For this purpose, the processor also includes predictor update logic 127. Predictor update logic 127 is responsive to an update indication from branch execution unit 121 and configured to update array entries in one or more of the local BHT 105a, global BHT 105b, and global selector 105c. The predictor hardware 105a, 105b, and 105c may have write ports distinct from the read ports used by the instruction fetch and prediction operation, or a single read/write port may be shared. Predictor update logic 127 may further be operatively coupled to link stack 117a and count register stack 117b.

Referring now to condition register file (CRF) 123, CRF 123 is read-accessible by BRU 121 and can be written to by the execution units, including but not limited to, a fixed point unit (FXU) 141, a floating point unit (FPU) 143, and a vector multimedia extension unit (VMXU) 145. A condition register logic execution unit (CRL execution) 147 (also referred to as the CRU), and special purpose register (SPR) handling logic 149 have read and write access to condition register file (CRF) 123. CRU 147 performs logical operations on the condition registers stored in CRF file 123. FXU 141 is able to perform write updates to CRF 123.

Processor 104 further includes a load/store unit 151, and various multiplexors 153 and buffers 155, as well as address translation tables 157, and other circuitry.

Executing within processor 104 are applications or routines that employ mathematical libraries to perform certain mathematical operations, including floating point operations. With floating point operations, there are various controls that may be set for the operations, including, for example, a rounding mode control, such as round-to-nearest, round towards the nearest with ties to even, round towards zero, round towards plus infinity, round towards minus infinity, etc.

Certain mathematical libraries use particular rounding modes that may return incorrect or implausible results. Therefore, code has been added to the libraries and/or to routines calling the libraries to change the rounding mode to one that provides correct results. For instance, the rounding mode may be changed to round-to-nearest. Other examples also exist.

One example of code used to change or set the rounding mode (rm) is as follows:

```
math( )
{
    old_rm = read_rm( )
    set_rm(ROUND_TO_NEAREST);
    do math;
    set_rm(old_rm);
}
```

Figure 2A:
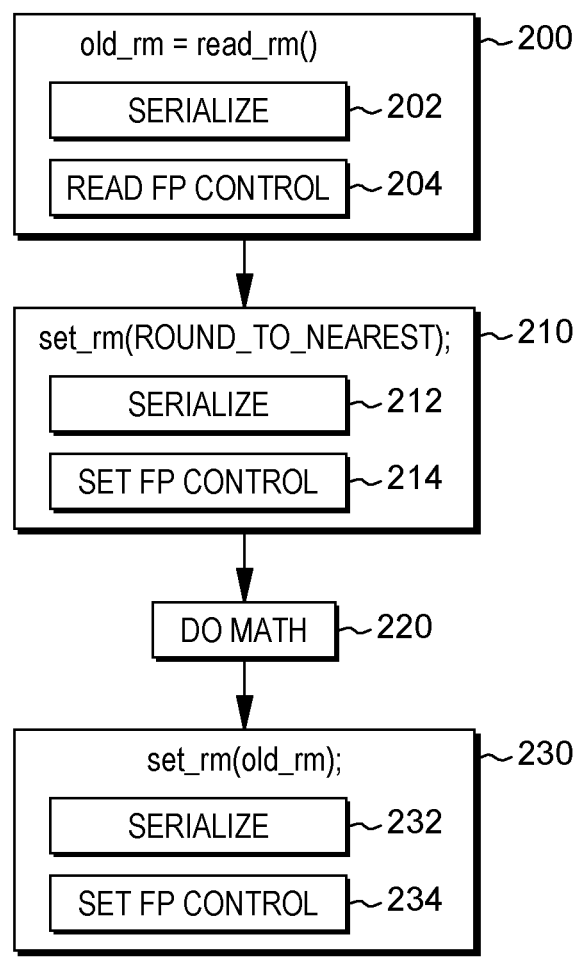
FIG. 2A depicts one example of code used to change the rounding mode of a floating point operation.

Further details regarding executing this code are described with reference to FIG. 2A. As shown, initially the old or current rounding mode is read from, e.g., the floating point (FP) control register, and stored in old_rm (e.g., old_rm=read_rm( )), STEP 200. This operation includes performing serialization to cease processing of the processors that may access the floating point control register, STEP 202, and then reading the floating point control register and storing the read value in old_rm, STEP 204. Thereafter, a set_rm instruction is used to set the rounding mode to a selected rounding mode, such as round to the nearest (e.g., set_rm(ROUND_TO_NEAREST)), STEP 210. Again, this includes a serialization process 212, and setting the rounding mode of the floating point control register to round-to-nearest, STEP 214. After the rounding mode is set, one or more mathematical operations are performed, STEP 220, and then the rounding mode is set back to the old rounding mode (e.g., set_rm(old_rm)), STEP 230. Again, this includes a serialization process, STEP 232, and then, setting the rounding mode of the floating point control register to the value of old_rm, STEP 234.

In a further embodiment, to reduce the overhead associated with performing the set rounding mode operation, another coding pattern is provided that tests for the rounding mode and only executes the code to change the rounding mode when necessary. One example of this code is shown below:

```
my_math_function( )
{
    rounding_mode = non_sync_read_fp_state( );
    if (rounding_mode != ROUND_TO_NEAREST)
        set_fp_state(ROUND_TO_NEAREST);
    do work;
    if (rounding_mode != ROUND_TO_NEAREST) set_fp_state
        (rounding_mode);
}
where != refers to not equal.
```

Figure 2B:
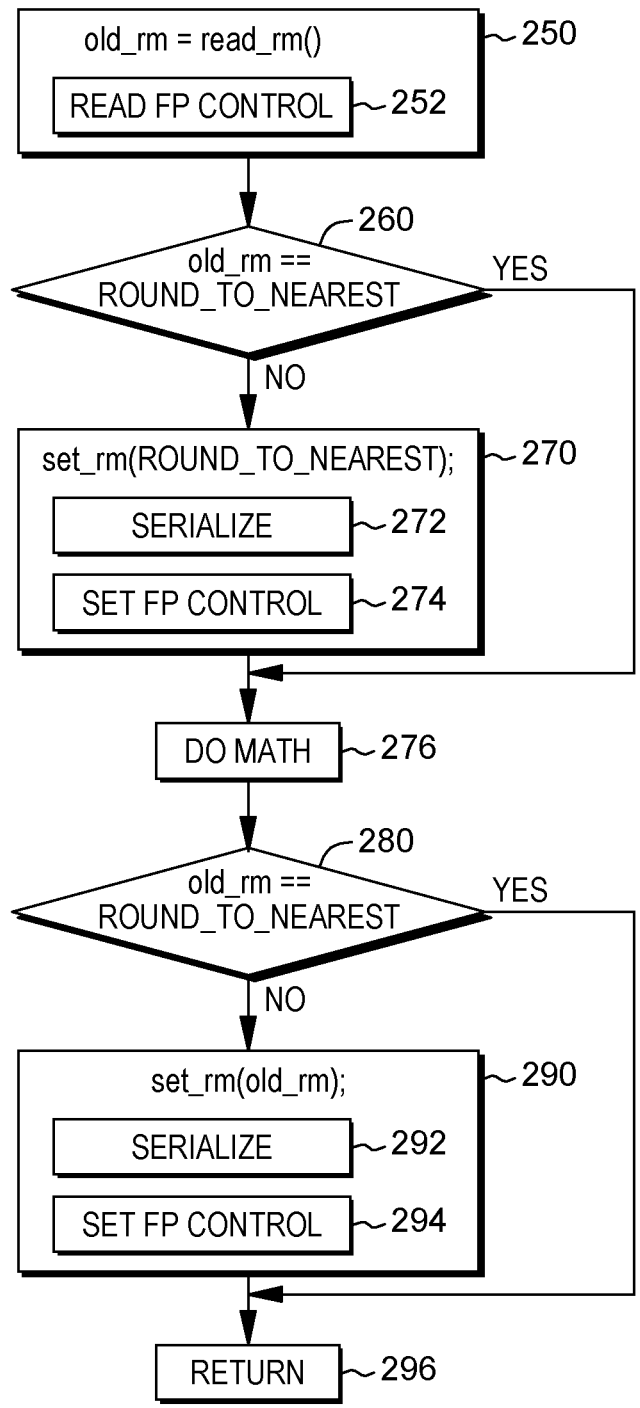
FIG. 2B depicts another example of code used to change the rounding mode of a floating point operation.

As shown in FIG. 2B, with this execution, old_rm is set equal to the current rounding mode (e.g., old_rm=read_rm( )), STEP 250. This includes, e.g., reading the rounding mode from the floating point control register and setting old_rm to the read rounding mode, STEP 252. In this example, that operation is a non-serialized operation. Then, a determination is made as to whether the old rounding mode is equal to a selected rounding mode, such as round_to_nearest (e.g., old_rm==ROUND_TO_NEAREST), INQUIRY 260. If the rounding mode is not already set to the selected rounding mode, round_to_nearest, then a set rounding mode instruction is used to set the rounding mode to the selected rounding mode, e.g., round_to_nearest (e.g., set_rm (ROUND_TO_NEAREST)), STEP 270. This includes, for instance, performing serialization to cease processing of the processors, STEP 272, and setting the rounding mode in the floating point control register to round_to_nearest, STEP 274. Thereafter, or if the rounding mode is already set to the selected rounding mode, e.g., round_to_nearest, one or more mathematical operations are performed, STEP 276, and then, a further determination is made as to whether the old rounding mode is set to the selected rounding mode, e.g., round_to_nearest (e.g., old_rm==ROUND_TO_NEAREST), INQUIRY 280. If it is not set to the selected rounding mode, e.g., round_to_nearest, then it is set to restore the rounding mode which was in use on entry to the function (e.g., set_rm(old_rm)), STEP 290, which includes performing serialization, STEP 292, and setting the rounding mode in the floating point control register, STEP 294. Thereafter, or if the rounding mode is already set to the selected rounding mode, e.g., round_to_nearest, then processing returns, STEP 296.

While the above reduces some of the serialization, there are costs associated with branch prediction and non-linear control flow. Further, although the examples herein describe updating a floating point control register, in other examples, the floating point controls may be maintained in a location other than a register. Many possibilities exist.

Figure 3A:
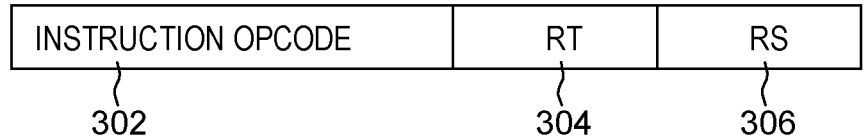
FIGS. 3A-C depict examples of a Read and Set Floating Point Status and Control instruction, in accordance with aspects of the present invention.

In accordance with an aspect of the present invention, to reduce costs associated with the serialization and branch prediction of the above examples, an instruction is introduced that reads the existing floating point controls (e.g., from the floating point control register) and saves the read floating point controls in one operand and writes new floating point controls to another operand, as described herein. This instruction is referred to herein as a Read and Set FP (Floating Point) Status and Control (RSFPS) instruction or a Read and Set Floating Point Control instruction, also represented by read_and_set_fp_state( ). One embodiment of a format of this instruction is depicted in FIG. 3A. As shown, a Read and Set FP Status and Control instruction 300 includes an operation code (opcode) field 302 having an opcode indicating a read and set floating point control operation; a target operand (RT) 304, which specifies, for instance, a general purpose register to receive current floating point control values; and a source operand (RS) 306, which specifies updated floating point control values. In one embodiment, each of the fields is separate from one another. However, in other examples, one or more fields may be combined. Further, in one implementation, the Read and Set FP_control instruction is an architected machine instruction. In one example, it is a single architected machine instruction at the hardware/software interface.

In one example operation of the RSFPS instruction, the existing floating point controls are read from, e.g., the floating point control register, and saved in the target operand, also referred to herein as old_fp operand. This operand may be stored in a selected location, such as, for instance, in a general purpose register, in memory, in a floating point special purpose register, in a control register, in another register, or as an integer, as examples. Further, as part of the operation, the instruction (e.g., as a single atomic unit) writes new floating point controls specified by the source operand, also referred to as new_fp state, to the floating point control register. Again, this operand may be stored in a selected location, such as, for instance, in memory, in a floating point special purpose register, in a control register, in a general purpose register, in another register, or as an integer, as examples.

In a further embodiment, the instruction includes a field that is used to select one or more of the floating point controls to be read and simultaneously write-updated. For example, a floating point rounding mode control may be selected and/or other controls, such as decimal FP rounding mode, binary FP rounding mode, hexadecimal FP rounding mode, data exception code, etc.

Figure 3B:
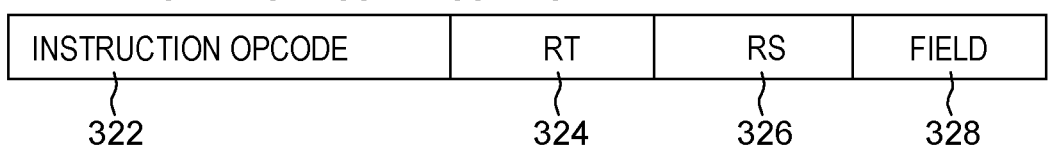

One example of a format of a RSFPS instruction with such a field is described with reference to FIG. 3B. In one example, a Read and Set FP Status and Control instruction 320 includes an operation code field 322 having an opcode indicating a read and set floating point control operation; a target operand (RT) 324 to receive current floating point control values; a source operand (RS) 326 to specify updated floating point control values; and at least one field 328 to be used to indicate the specific floating point control to be read/updated. The field may be an immediate field of the instruction which includes the specific floating point control, or the field may include an indication of a location (e.g., in memory, a general purpose register, a special purpose register, etc.) that includes the specific floating point control. Other variations are also possible.

Figure 3C:
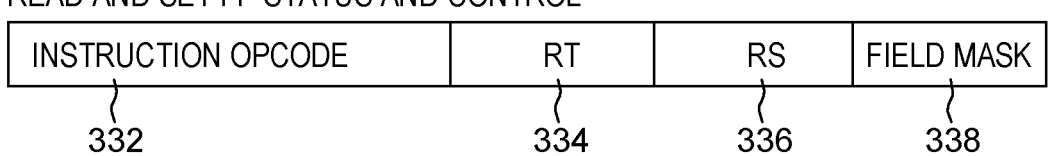

In yet a further embodiment of the Read and Set FP Status and Control instruction, a bit mask is used to indicate a plurality of floating point controls to be read and updated. One example of this format is depicted in FIG. 3C. As shown, in one example, a Read and Set FP Status and Control instruction 330 includes an operation code field 332 having an opcode indicating a read and set floating point control operation; a target operand (RT) 334 to receive current floating point control values; a source operand (RS) 336 to specify updated floating point control values; and a field mask 338, which includes a bit mask for the plurality of floating point controls that may be updated. The bit mask includes, for instance, a bit for each possible floating point control to be selected to be updated, and if a particular bit is set to a particular value, such as one, then that particular control is read and updated. Other variations are possible. The field mask may be included in an immediate field of the instruction, or the field mask field of the instruction may include an indication of a location (e.g., in memory, a general purpose register, a special purpose register, etc.) that includes the mask. Other variations are also possible.

As described herein, the Read and Set Floating Point Status and Control instruction reduces the number of instructions and operations to be performed to update the floating point controls. For example, the Read and Set Floating Point Status and Control instruction reads the floating point control register and updates the floating point control register with the values of the source operand as part of one instruction, i.e., as one atomic operation. This reduces the amount of serialization that is needed, as described with reference to FIGS. 4A-4B.

Figure 4A:
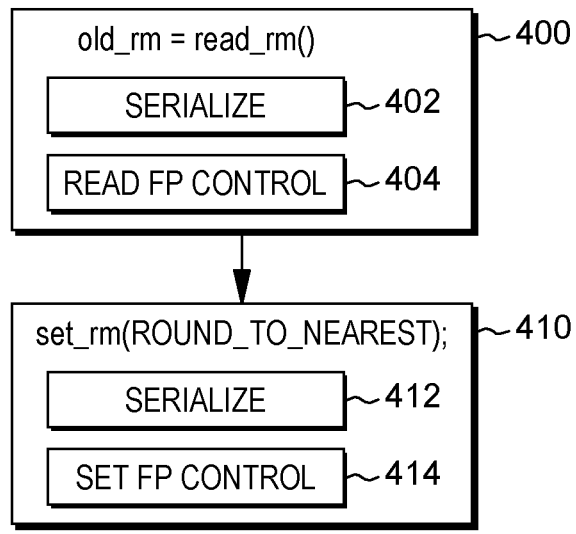
FIG. 4A depicts another example of setting the rounding mode of a floating point operation.

As shown in FIG. 4A, a conventional technique for updating the rounding mode of the floating point controls includes reading the current rounding mode and storing it in old_rm (e.g., old_rm=read_rm( )), STEP 400. This operation includes performing serialization to cease processing of the processors that may access the floating point control register, STEP 402, and then reading the floating point (FP) control register and storing the read value in old_rm, STEP 404. Thereafter, a set_rm instruction is used to set the rounding mode to a selected rounding mode, such as round-to-nearest (e.g., set_rm(ROUND_TO_NEAREST)), STEP 410. Again, this includes a serialization process 412, and setting the rounding mode of the floating point control register to round-to-nearest, STEP 414.

Figure 4B:
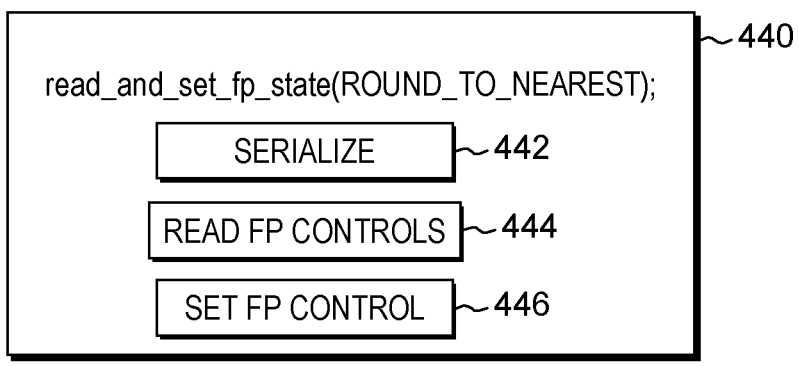
FIG. 4B depicts one example of setting the rounding mode of a floating point operation, in accordance with an aspect of the present invention.

In contrast, as shown in FIG. 4B, by using the Read and Set Floating Point Status and Control instruction 440 to set the rounding mode to round_to_nearest (Note: One or more fields of the instruction are not depicted), one serialization process is performed, STEP 442. Then, the floating point controls, including rounding mode, are read, STEP 444, and at least the rounding mode control is updated, STEP 446. The additional serialization (e.g., serialization 412) is not needed or used. Therefore, the Read and Set FP Status and Control instruction facilitates processing by performing the update absent at least one serialization process; thereby, enhancing performance within the computing environment.

As indicated above, in one embodiment, one or more controls are explicitly specified for reading and updating. Thus, rather than reading the entire set of controls or the entire floating point control register and extracting the fields using software instructions (such as shift and masking), only a single field (or a plurality of explicitly specified fields) is read. Advantageously, synchronization is only performed on the one or more indicated fields. This is further described with reference to FIG. 5.

Figure 5:
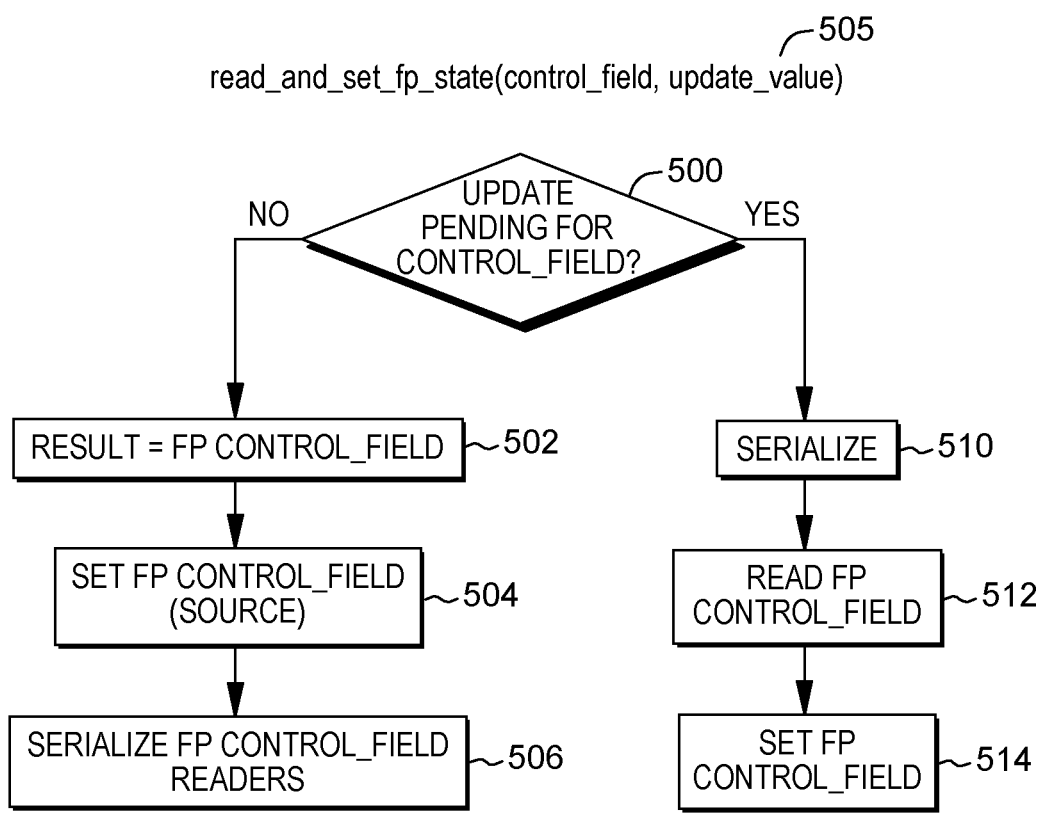
FIG. 5 depicts one embodiment of setting a selected control field of a floating point control register, in accordance with an aspect of the present invention.

As shown in FIG. 5, based on executing a Read and Set Floating Point Status and Control instruction (Note: One or more fields of instruction are not depicted) that specifies a particular field to be updated (e.g., control_field), a determination is made as to whether an update is already pending for that particular field, INQUIRY 500. For instance, a counter of pending updates for that field may be checked. If there is no update already pending, then serialization is not performed, and a term, RESULT, is set equal to the current value of the specified field of the floating point control in the floating point control register, STEP 502. In at least one embodiment, RESULT corresponds to an operand specified by the Read and Set Floating Point Status and Control instruction (e.g., the target (RESULT) register RT). Further, the specified field of the floating point control is set equal to an updated value (e.g., update_value 505), which is specified, e.g., in the source operand of the instruction, STEP 504. In at least one embodiment, the update value corresponds to an operand specified by the Read and Set Floating Point Status and Control instruction (e.g., the source (SOURCE) register RS). Further, readers of the particular floating point control being updated are serialized (i.e., they wait for the control field to be updated before accessing the field), STEP 506.

Returning to INQUIRY 500, if an update is already pending for this particular floating point control_field, then serialization relative to the updated field is performed (e.g., forcing processing to complete prior to reading), STEP 510. Further, the floating point control_field is read from the floating point control register, STEP 512, and updated, STEP 514.

As described above, a Read and Set Floating Point Status and Control instruction is provided that enables a specification of one or more fields to be updated; thereby, reducing the amount of instructions to be executed and avoiding the need to wait on the completion of instructions that set unrelated fields. In one implementation, the instruction forces the completion of previous floating point instructions and holds back subsequent instructions. However, it is determined that frequently (e.g., over 95% of executions in common applications) the new and old rounding mode are the same. Thus, in accordance with an aspect of the present invention, there is provided an implementation of the rsfps instruction with an accelerated null update. The instruction is either selected automatically in the micro-architecture, based on receiving an rspfs instruction, or a separate rsfps_fn instruction (rsfps with fast null update) is provided. In one embodiment, the specified fields of the rsfps or rsfps_fn instruction are read by the instruction, and a comparison of the current values of the specified fields with the newly to be written field values is performed. If the new values are the same as the old values, the instruction completes, and the old values are written to the target register. Further details regarding this processing are described with reference to FIG. 6.

Figure 6:
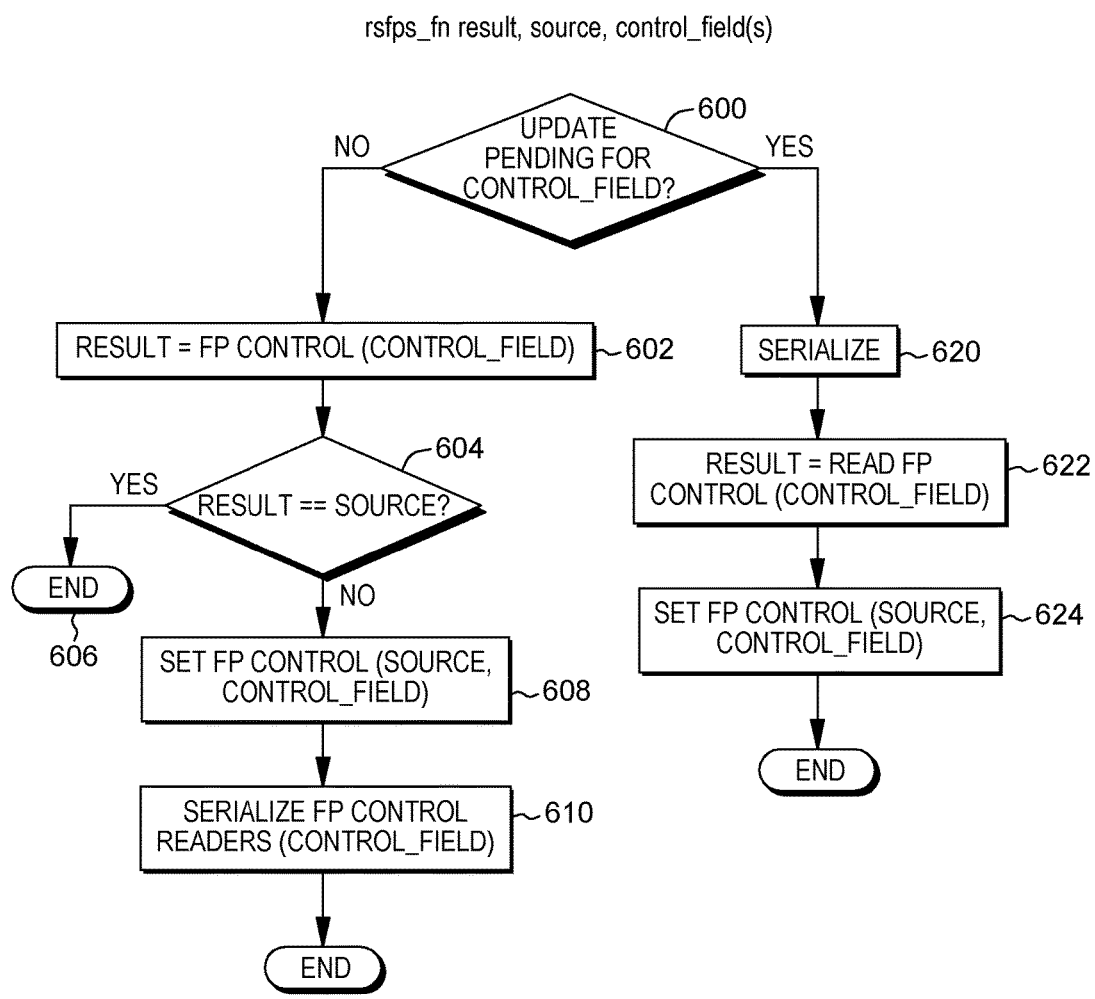
FIG. 6 depicts another embodiment of setting a selected control field of a floating point control register, in accordance with an aspect of the present invention.

Referring to FIG. 6, in one embodiment, upon receipt of an rsfps_fn instruction (or an rsfps instruction to be treated as an rspfs_fn instruction), a determination is made as to whether there is an update pending for the control field (or control fields) specified in the instruction, INQUIRY 600. If there is no update already pending for the control field, then serialization is not performed and a term, RESULT, is set equal to the current value of the specified field of the floating point control, STEP 602. Then, a determination is made as to whether the value of RESULT equals the value of the source operand, INQUIRY 604. In one embodiment, the RESULT term corresponds to a target register RT of the instruction, and the source operand corresponds to a source register RS of the instruction. In other embodiments, source and/or target may correspond to memory operands, special purpose registers, or other operand specifiers. If RESULT equals the value of the source operand, then processing is complete, STEP 606. That is, no update or serialization of readers of the specified field is performed. Otherwise, the specified floating point control is set, STEP 608. For instance, the specified control field is set to the source value of the instruction. Thereafter, the readers that use that control field are serialized, STEP 610. In another embodiment, all floating point instructions may be serialized. Other implementations also exist.

Returning to INQUIRY 600, if there is a current update pending for the control field, then serialization relative to the field being updated is performed, STEP 620. For instance, updates to the control field are to complete before processing continues; and readers of the control field are serialized. In other embodiments, all floating point instructions may be serialized. Other implementations are also possible. Thereafter, RESULT is set equal to the current value of the control field, STEP 622, and the floating point control field is set to the new value, STEP 624. For instance, the control field is set to the value of the source operand of the instruction. This completes processing.

Although the above processing describes updating one control field, similar processing may be performed for a plurality of control fields.

In a further embodiment, the old value is speculatively written as a copy of the new value even before the check, and thus, dependent instructions may proceed immediately. Further, in one embodiment, floating point compute instructions (but not other rsfps or other instructions that may update the specified fields) are allowed to pass the rsfps_fn instruction, so there is no restriction of scheduling freedom for traditional floating point instructions.

Figure 7:
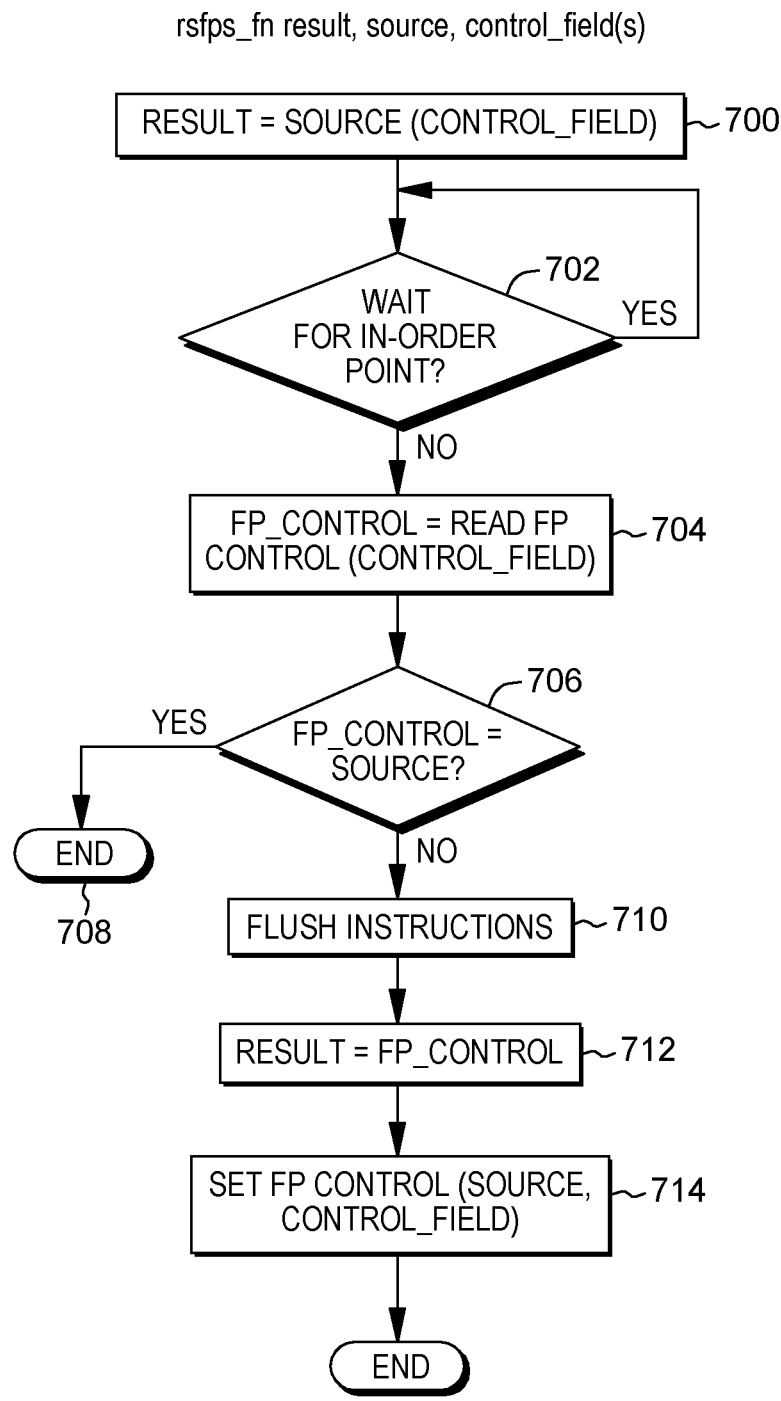
FIG. 7 depicts another example of setting selected control fields of a floating point control register, in accordance with an aspect of the present invention.

Further details regarding the Read and Set Floating Point Status and Control instruction with an optimized null update are described with reference to FIG. 7. Based on receipt of an rsfps_fn instruction (or an rsfps instruction to be implemented as an rsfps_fn instruction), RESULT is set equal to the source value of the control field specified by the instruction, STEP 700. The setting of RESULT may be executed out-of-order (e.g., as a first internal operation) allowing instructions dependent on RESULT and the floating point control to execute. Thereafter, a determination is made as to whether processing is to wait for an in-order point, INQUIRY 702. In one example, a state machine may be used to determine when the in-order point is reached. If processing is to wait for an in-order point, processing just waits. Otherwise, or subsequent to reaching an in-order point, a term, FP_control, is set equal to the value in the control register of the control field specified by the instruction, STEP 704. Then, a determination is made as to whether FP_control is equal to the value of the source operand of the instruction, INQUIRY 706. That is, is FP_control equal to what the user requested? If yes, then processing is complete, since speculation was correct (i.e., the use of RESULT was proper and there was no change to the FP_control register, which has the user-specified value of the source already), STEP 708. Otherwise, there is a mispeculation and the instructions in the pipeline are flushed, STEP 710. In one embodiment, all instructions after the present instruction are flushed. In another embodiment, instructions depending on RESULT and floating point instructions are flushed. In yet another embodiment, instructions depending on RESULT and on the floating point control are flushed. Various possibilities exist. RESULT is then set equal to the current value of the specified floating point control (e.g., read in STEP 704), STEP 712, and the field specified by control_field in the floating point control register is set equal to the value of the source operand, STEP 714.

In one embodiment, when a mismatch of old and new values is discovered, recovery actions are taken. In one embodiment, the rsfps_fn instruction either stalls or is rejected and held to execute at the in-order point. Simultaneously, instructions following the rsfps_fn instruction are flushed and initialized to be re-executed in-order after the rsfps_fn instruction. In another embodiment, the first floating point instruction after the rsfps_fn and subsequent instructions (or subsequent floating point instructions) are flushed and initialized to be re-executed in-order after the rsfps_fn instruction. In another embodiment, the first floating point instruction after rsfps_fn that has been executed out-of-sequence and ahead of the rsfps_fn instruction and subsequent instructions (or subsequent floating point instructions) are flushed and initialized to be re-executed in-order after the rsfps_fn instruction.

The rsfps_fn instruction updates the old_fp operand (also referred to herein as RESULT) with the values retrieved from the floating point control for at least those fields specified and updates the floating point control (specified floating point control fields) at the in-order execution point (e.g., when it is at a next-to-complete in the instruction sequencing unit). When the rsfps_fn instruction has previously written a speculative value to the old_fp operand by copying the new_fp (also referred to herein as SOURCE) state, speculating that no change will occur, it overwrites the speculatively written old_fp operand value with the correct floating point operand value. Then, instructions following the rsfps_fn instruction are flushed and initialized to be re-executed in order after the rsfps_fn instruction. Alternatively, instructions following the rsfps_fn instruction that have read the old floating point state are flushed and initialized to be re-executed in-order after the rsfps_fn instruction. The rsfps_fn instruction completes and execution continues.

In one example, for a null update (i.e., the updated value is the same as the current value), a read is performed to check if the update is null, and a conditional branch is performed to skip the synchronizing update if it is null. Then, at restore time, a determination is once again made to check whether there is something to be restored, and a conditional branch may be performed around the update. Therefore, in accordance with one aspect of the present invention, a non-synchronizing update is performed when the update is a null update (i.e., no change to the current settings). An instruction with a non-synchronizing (free) null update may enable code as follows:

```
my_math_function( )
{
    rounding_mode = non_sync_read_fp_state( );
    set_fp_state(ROUND_TO_NEAREST):
    do work;
    set_fp_state(rounding_mode);
}
```

As described above, various aspects of the present invention provide two instructions: the rsfps and the rsfps_fn instructions. Thus, programmers may choose between one or the other. However, runtime information may not be available to the programmer; customers in different application spaces may have different needs; and/or application profiles may change over time. Therefore, the programmer may make an incorrect decision in selecting one of the rsfps and rsfps_fn instruction variants that negatively affects performance. Thus, in accordance with one aspect of the present invention, a read and set floating point state with predicted fast null update operation is provided. As examples, a new instruction, Read and Set FP State with Predicted Fast Null Update (rsfps_pfn), is provided; and in other embodiments, one or both of the rsfps and rsfps_fn instructions trigger the execution of the rsfps_pfn technique. The rsfps_pfn instruction may have a plurality of implementations, including, for instance: rsfps_pfn old_fp, new_fp; rsfps_pfn old_fp, new_fp, <field>; rsfps_pfn old_fp, new_fp <field mask>, similar to the rsfps examples. When the rsfps_pfn technique is invoked, a predictor is queried to make a prediction. The prediction is either TRUE or FALSE and corresponds to whether performing the rspfs instruction form with fast null update is desirable or not. When the prediction is made and the prediction is TRUE, the rsfps_pfn technique invokes the rsfps_fn technique of performing a floating point status update with a fast null update. (In another embodiment, a FALSE may trigger this update technique.) A test is made as to whether a null update occurred, and then, the predictor is updated. In other embodiments, based on receiving an rsfps_pfn instruction, decode logic generates one of two internal instructions corresponding to the description of the functions described for rsfps_fn and rsfps hereinabove, when the predictor indicates whether a fast null update will be beneficial (e.g., TRUE) or not (e.g., with the prediction FALSE).

Further, in one example, when the prediction is made and the prediction is FALSE, the rsfps_pfn technique invokes the rsfps_fn technique of performing a floating point control update without a fast null update. (In another embodiment, TRUE triggers this update technique.) A test is made as to whether a null update occurred, and then, the predictor is updated.

A variety of predictor architectures may be used. Any of the known or future proposed predictor architectures may be used in conjunction with aspects of the invention. For instance, single bit or multi-bit predictors with hysteresis may be used. Symmetric decisions may be made for multi-bit predictors (equally many states encoded by the bits reflecting TRUE or FALSE), or asymmetric decisions may be made (more states for one of TRUE or FALSE at the expense of fewer for other states). The same predictor may be used for rsfps_pfn and other instructions (e.g., branches). Different predictors may be used. Different predictor architectures may be used. Different predictor arrays may be used. Same predictor arrays, but different predictors and predictor architectures may be used. Many variations are possible. Further details regarding one embodiment of using prediction are described with reference to FIGS. 8A-8B.

Figure 8A:
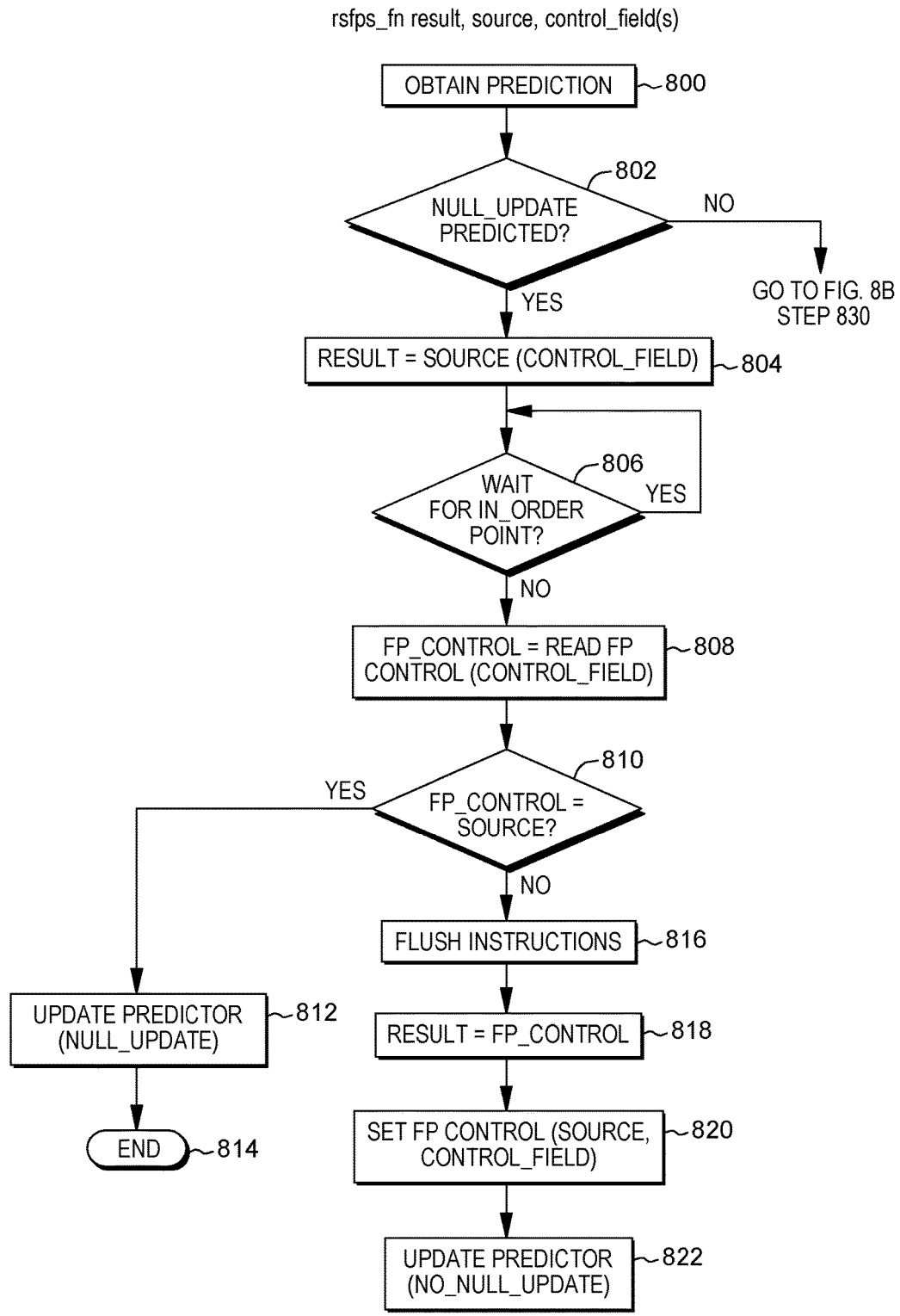
FIGS. 8A-8B depict another example of setting selected control fields of a floating point control register, in accordance with aspects of the present invention.
Figure 8B:
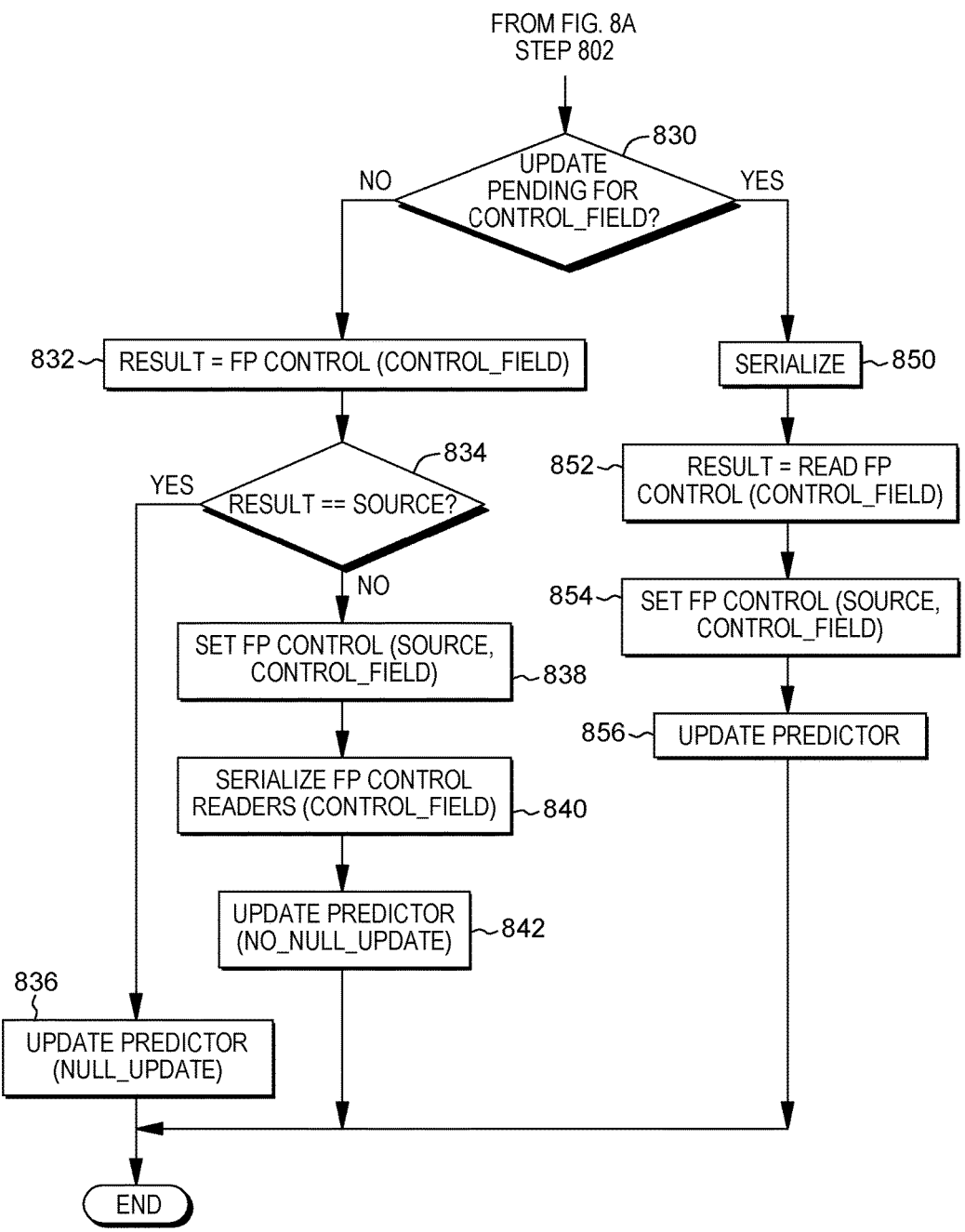

Referring initially to FIG. 8A, a prediction is obtained, STEP 800, and a determination is made as to whether null update is predicted, INQUIRY 802. If null update is predicted, then RESULT is set equal to the source value of the control field specified by the instruction, STEP 804. The setting of RESULT may be executed out-of-order (e.g., as a first internal operation) allowing instructions dependent on RESULT and the floating point control to execute. Thereafter, a determination is made as to whether processing is to wait for an in-order point, INQUIRY 806. In one example, a state machine may be used to determine when the in-order point is reached. If processing is to wait for an in-order point, processing just waits. Otherwise, or subsequent to reaching an in-order point, FP_control is set equal to the value in the control register of the control field specified by the instruction, STEP 808. Then, a determination is made as to whether FP_control is equal to the value of the source operand of the instruction, INQUIRY 810. That is, is FP_control equal to what the user requested? If yes, then the predictor may be updated to indicate that a null update has been performed successfully, STEP 812, and processing is complete, since speculation was correct, STEP 814. Otherwise, there is a mispeculation and the instructions in the pipeline are flushed, STEP 816. In one embodiment, all instructions after the present instruction are flushed. In another embodiment, instructions depending on RESULT and floating point instructions are flushed. In yet another embodiment, instructions depending on RESULT and on the floating point control are flushed. Various possibilities exist. RESULT is then set equal to the current value of the specified floating point control, STEP 818, and the floating point control is set equal to the value of the source operand, STEP 820. Further, the predictor is updated to indicate that a null update was not performed, STEP 822.

Returning to INQUIRY 802, if a null update is not predicted, then a determination is made as to whether there is an update pending for the control field (or control fields) specified in the instruction, INQUIRY 830. If there is no update already pending for the control field, then serialization is not performed and RESULT is set equal to the current value of the specified field of the floating point control, STEP 832. Then, a determination is made as to whether the value of RESULT equals the value of the source operand, INQUIRY 834. If RESULT equals the value of the source operand, then the predictor is updated to indicate null update, STEP 836, and processing is complete. That is, no update of the floating point control or serialization of readers of the floating point control is performed. Otherwise, if RESULT does not equal SOURCE, the specified floating point control is set, STEP 838. For instance, the specified control field is set to the source value of the instruction. Thereafter, the readers that use that control field are serialized, STEP 840. In another embodiment, all floating point instructions may be serialized. Other implementations also exist. Further, the predictor is updated to indicate no null update, STEP 842.

Returning to INQUIRY 830, if there is a current update pending for the control field, then serialization relative to the field being updated is performed, STEP 850. For instance, updates to the control field are to complete before processing continues; and readers of the control field are serialized. In other embodiments, all floating point instructions may be serialized. Other implementations are also possible. Thereafter, RESULT is set equal to the current value of the control field, STEP 852, and the floating point control field is set, STEP 854. For instance, the control field is set to the value of the source operand of the instruction. Additionally, the predictor is updated depending on whether the update changed the floating point control value for the selected field. For instance, if the update changed the floating point control value for the selected field (SOURCE!=RESULT), the predictor is updated to indicate that a null update was not performed (i.e., NO_NULL_UPDATE); and if the update did not change the floating point control value for the selected field (SOURCE==RESULT), the predictor is updated to indicate that a null update was performed (i.e., NULL_UPDATE), STEP 856. This completes processing.

Although the above processing describes updating one control field, similar processing may be performed for a plurality of control fields. In other embodiments, an instruction may specify multiple fields to be so processed, in accordance with embodiments of the invention described herein. In yet other embodiments, no field(s) may be specified and the floating point control register may be updated in its entirety in accordance with aspects described herein.

As described herein, programmers are to set the rounding mode and/or other controls prior to a floating point operation. However, in accordance with another aspect of the present invention, a capability is provided to manage the rounding mode or other floating point control to be used by an instruction, absent the cost of setting the rounding mode or other control in the floating point control register. This capability includes employing a control prefix, such as a rounding mode prefix, that indicates no matter what value the machine has set for that floating point control, floating point operations are to be executed with the user-specified control, e.g., round-to-nearest, without updating a global resource, such as the floating point control register. This reduces the cost of updating global resources. The control prefix, such as the rounding mode prefix, precedes an instruction. For instance, a prefix may be added in front of an instruction, such as:

ROUND_NEAREST FADD RT, RS1, RS2

In this example, Round_Nearest is placed in front of a floating point add (FADD) instruction.

As another example, a Round_Up prefix is placed in front of a floating point multiplication (FMUL) instruction:

ROUND_UP FMUL RT, RS1, RS2

Many other examples are possible.

In accordance with one embodiment, the control prefix is decoded in conjunction with an instruction. For instance, a "perform instruction with fixed controls, such as fixed rounding mode" internal instruction is generated. The control, such as the rounding mode, is obtained from the prefix. The control, such as the rounding mode, is used in executing the instruction, in lieu of the rounding mode in the control register.

Figure 9A:
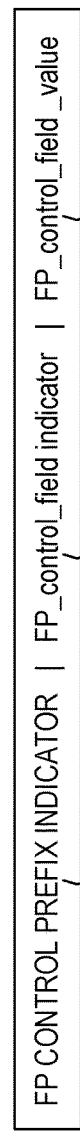
FIGS. 9A-9D depict examples of prefix instructions used in accordance with one or more aspects of the present invention.

In one or more embodiments, prefix instructions may be included in an instruction stream and decoded as part of that stream. Example prefix instructions are described with references to FIGS. 9A-9D. Referring to FIG. 9A, in one embodiment, a prefix instruction 900 includes a floating point control prefix indicator (e.g., an opcode) 902 indicating a prefix operation; a floating point control field indicator 904 specifying a floating point control to be user-specified; and a floating control field value 906 indicating a user-specified value for the control. An example of the floating point control field indicator is rounding mode, and example control field values include nearest, up, down, to_zero, away_from_0, etc. Other controls and/or other values may be provided.

Figure 9B:

In another embodiment with reference to FIG. 9B, a prefix instruction 910 includes a floating point control prefix indicator 912, and a floating point control indicator 914. In this example, the field and value are combined into one field. As examples, the floating point control indicator includes round_to_nearest, round_up, round_down, indicate_imprecise, etc.

Figure 9C:
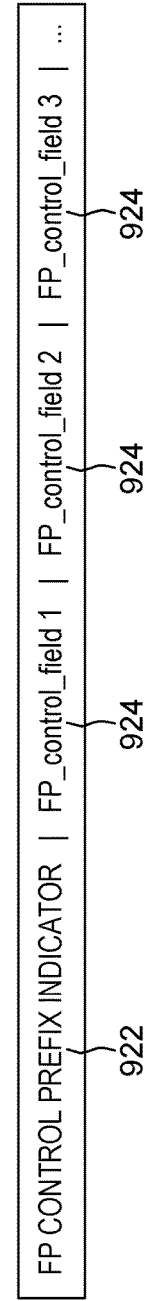

In yet another embodiment with reference to FIG. 9C, a prefix instruction 920 includes a floating point prefix indicator 922, and one or more floating point control fields 924, in which a value may be specified in each field. In one example embodiment, each control field consists of an indicator (e.g., 904) and a value (e.g., 906). In another example embodiment, each control field is an FP control indicator (e.g., 914). In one such example embodiment, the fields are positional, for example, the first field may be specified to provide rounding, the second field to provide NaN handling, and so forth. Yet other embodiments are possible in accordance with the teachings herein.

Figure 9D:
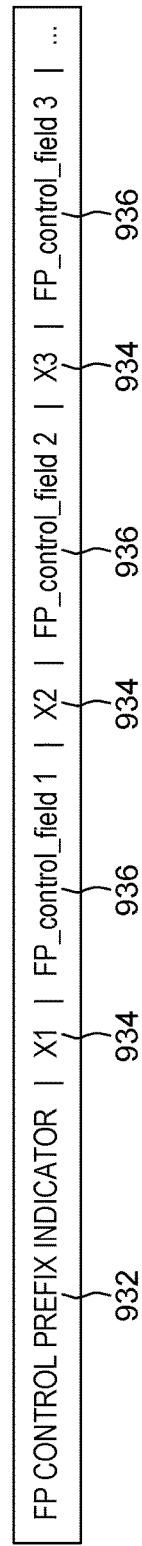

In yet a further embodiment with reference to FIG. 9D, a prefix instruction 930 includes a floating point control prefix indicator 932; a plurality of enable masks 934; and a plurality of control fields 936. In this example, the mask that precedes the control field indicates whether the value in the field is to be used instead of the value in the control register. For instance, if the mask value is set to e.g., 1, then the value in the succeeding control field is used, instead of the value in the control register. Many possibilities exist.

Although various embodiments of a prefix instruction are provided herein, other variations may be used without departing from one or more aspects of the present invention. Further, each instruction may have more, fewer and/or different fields. Many possibilities exist.

Figure 10:
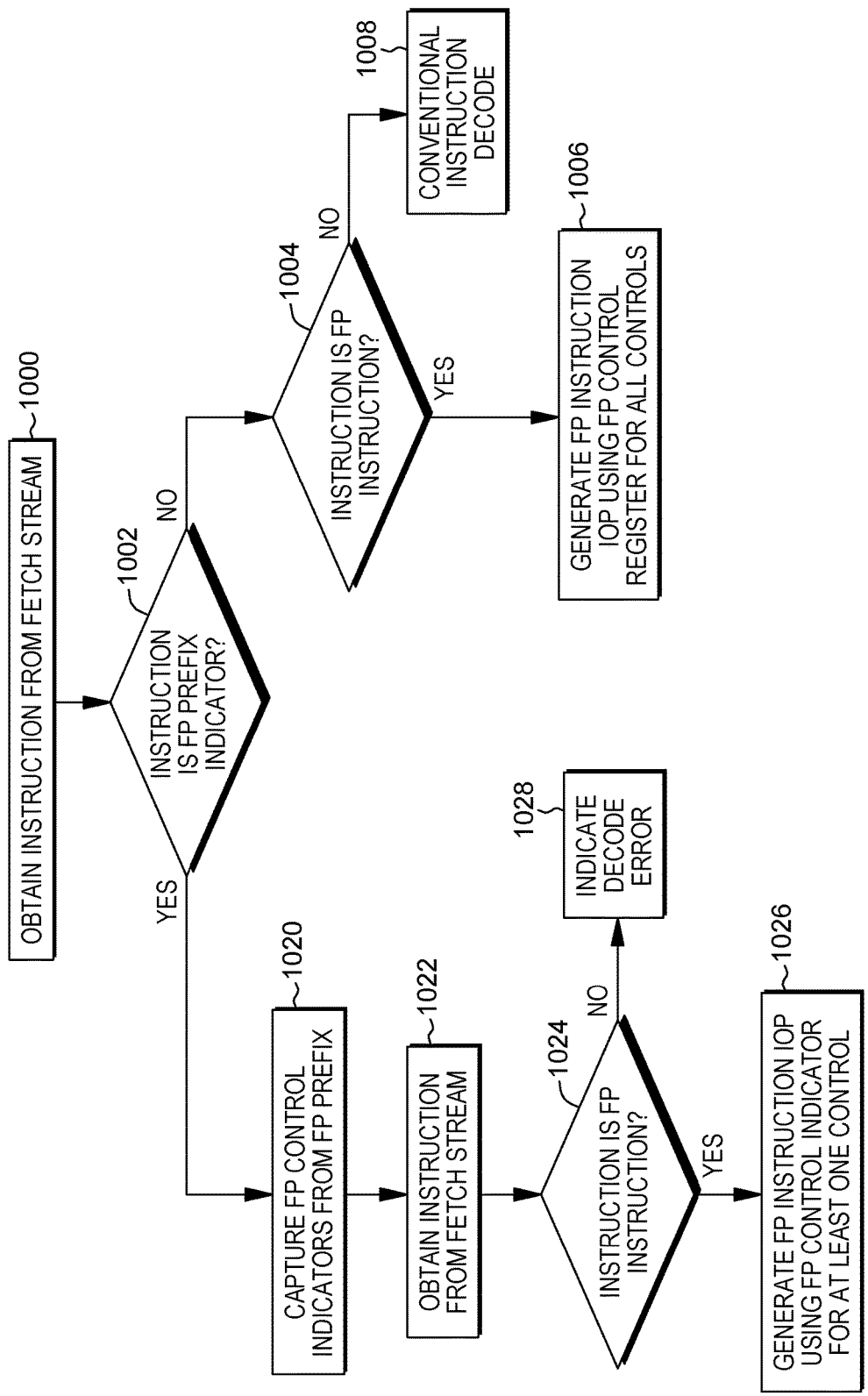
FIG. 10 depicts further details of using a prefix instruction, in accordance with an aspect of the present invention.

Further details relating to using a prefix instruction are described with reference to FIG. 10. In one example, it is the decode logic that performs this processing. Initially, an instruction is obtained from the fetched instruction stream, STEP 1000, and a determination is made as to whether the fetched instruction is a floating point prefix indicator instruction (e.g., based on the opcode or one or more other parameters), INQUIRY 1002. If it is not a prefix instruction, then a further determination is made as to whether the instruction is a floating point instruction (e.g., based on the opcode or one or more other parameters), INQUIRY 1004. If it is a floating point instruction, then internal operations are generated for the floating point instruction using the floating point control register for the controls, STEP 1006. However, if the instruction is not a floating point instruction, then conventional instruction decode is performed, STEP 1008.

Returning to INQUIRY 1002, if the instruction is a floating point prefix indicator, then the floating point control indicators are obtained from the instruction, STEP 1020. Thereafter, another instruction (e.g., a next instruction) is obtained from the instruction stream, STEP 1022, and a determination is made as to whether the instruction is a floating point instruction, INQUIRY 1024. If it is a floating point instruction, then internal operations are generated for the floating point instruction using values of the floating point control prefix indicator instruction for at least one control, STEP 1026. However, returning to INQUIRY 1024, if the instruction is not a floating point instruction, then a decode error is indicated, STEP 1028. As an example, based on indicating the decode error, error correction may be performed, and this may include performing no error processing and processing the instruction that was fetched; raising an exception; or performing some other processing. Other possibilities exist.

Subsequent to generating the internal operations, the internal operations are executed to perform the operation specified by the floating point instruction.

In further embodiments, a prefix or prefix instruction to indicate a particular control, such as rounding mode or another control, may be placed in front of specific types of floating point instructions, including, but not limited to, binary floating point instructions, decimal floating point instructions, hexadecimal floating point instructions, and/or vector floating point instructions. The prefix modifies the controls, e.g., rounding mode, used for executing that particular instruction. Further details regarding processing that may be used for different types of floating point instructions, including binary, decimal, hexadecimal, and/or others, are described with reference to FIG. 11.

Figure 11:
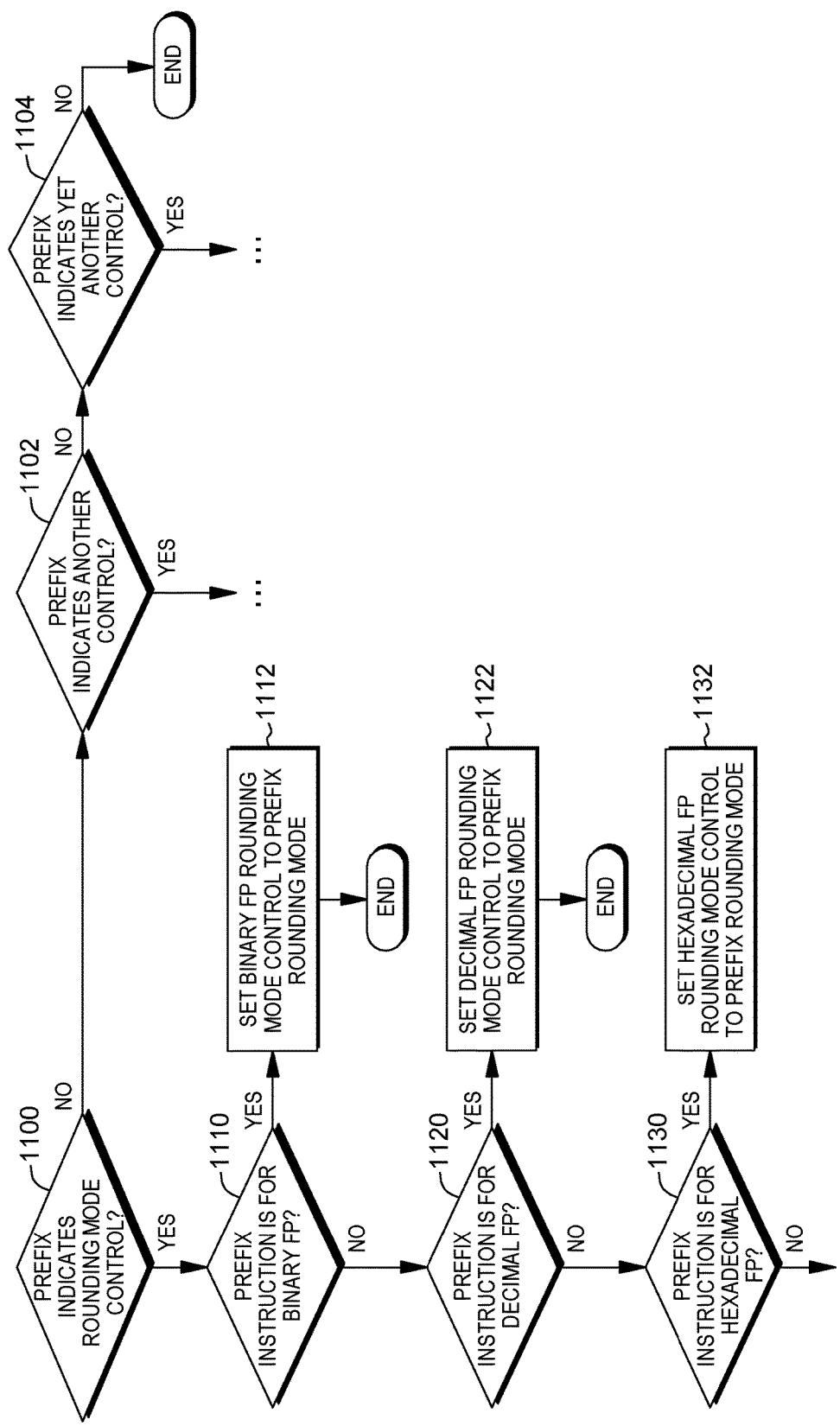
FIG. 11 depicts further embodiments of updating a rounding mode control for different types of arithmetic, in accordance with an aspect of the present invention.

Referring to FIG. 11, initially, in one implementation, a determination is made as to whether a prefix indicates a rounding mode control, INQUIRY 1100. If not, then a determination is made as to whether the prefix indicates one or more other controls, INQUIRIES 1102, 1104. If other controls are indicated, then processing is performed commensurate therewith. Returning to INQUIRY 1100, if the prefix indicates a rounding mode control, then a determination is made as to whether the prefix instruction is for a binary floating point instruction, INQUIRY 1110. If it is, then the binary floating point rounding mode control is set to the prefix rounding mode, STEP 1112. Returning to INQUIRY 1110, if it is not a prefix for a binary floating point instruction, then a further determination is made as to whether it is a prefix for a decimal floating point instruction, INQUIRY 1120. If so, then the decimal floating point rounding mode control is set to the prefix rounding mode, STEP 1122. Yet further, returning to INQUIRY 1120, if the prefix instruction is not for a decimal floating point instruction, then a further determination is made as to whether the prefix is for a hexadecimal floating point instruction, INQUIRY 1130. If it is, then the hexadecimal floating point rounding mode control is set to the prefix rounding mode, STEP 1132. The same processing may be performed for other types of floating point instructions, including vector floating point instructions or others. Many variations are possible.

Using a single prefix that modifies the behavior of a plurality of classes in a manner adapted to those instructions (e.g., when a rounding mode is specified, modify the binary FP rounding mode when the prefix is a prefix to a binary FP instruction; modify the hexadecimal FP rounding mode when the prefix is a prefix to a hexadecimal FP instruction; and so forth) reduces the size of prefixes and simplifies the generating of prefixed instructions.

As indicated, prefixes may be used for various controls, including rounding mode and/or other controls. In one aspect of the present invention, prefixes are used to provide fine-grained processing for floating point controls, such as floating point exceptions. A floating point exception is, e.g., an indication that a special event has occurred. The exception may be indicated by setting one or more indicators, such as one or more bits, in the floating point control register. For instance, conventionally, floating point exceptions may either be enabled or disabled based on an update to the floating point control register, and in particular, to the floating point exception control bits of that register. Users control the raising of exceptions by writing control enable bits. Users may ignore updates to the floating point status bits by reading the status bits prior to execution of a floating point instruction, and rewriting them back to the floating point control register after the instruction executes. To avoid such updates and any expenses associated therewith, which may affect application performance, in accordance with an aspect of the present invention, fine-grained control of exception enablement (or other controls) is provided.

In accordance with one aspect, a fine-grained floating point control prefix is provided. The floating point control prefix enables, e.g., the disabling or enabling of the reading of floating point exceptions. In one embodiment, floating point exceptions are controlled by a single prefix and all exceptions are either enabled or disabled by their prefix. One example of adding a prefix to a floating point add instruction is as follows:

EXCEPTION_ENABLE ILLEGAL, OVERFLOW FADD RT, RS1, RS2

This records register overflow and illegal operations for the next (prefixed) instruction. It does not record, e.g., underflow or imprecise result indications for the next instruction.

In another embodiment, the prefix includes a bitmap of floating point control bits to be enabled or disabled. In yet another embodiment, the indicated enabled or disabled bits are cumulative to the status of the floating point control register; i.e., the status bits indicated to be at least one of enabled or disabled or combined with the enablement and disablement status of the floating point controls. This enables a programmer to enable a control, disable a control, or specify to use the control value of the FP control register. An example of this is the following equation in which the FP status enablement control, fp_status_enablement, is combined with prefix-specified enable and disable bits, to yield an effective enablement value that controls the operation:

effective_enablement= fp_status_enablement & prefix_disabled | prefix_enabled where & is an AND operation and | is an OR operation.

In one embodiment, one prefix may enable one or more fields, and another prefix may disable one or more fields. In one embodiment, multiple prefixes may be combined to affect an instruction. Many variations are possible.

In yet another embodiment, a floating point exception recording control may be provided, such as:

FP_RECORD STICKY_OVERFLOW, ILLEGAL FADD RT, RS1, RS2

This records an overflow in a sticky overflow, and records an illegal operation in a non-sticky overflow.

Again, other examples are possible.

In addition or in lieu of adding prefixes to an instruction, prefix instructions may be added to an instruction stream prior to the instruction to be controlled by the prefix instruction. Example prefix instructions to manage one or more controls, such as exceptions, are described with reference to FIGS. 12A-12D.

Referring to FIG. 12A, one example of a control prefix instruction 1200 includes a floating point control prefix indicator 1202 (e.g., an opcode); one or more floating point exception indicators 1204 each specifying a floating point exception to be user-specified; and one or more floating point exception indicator values 1206 each indicating a user-specified value for the control. Example indicators include, for instance, exception type Imprecise, Overflow, Underflow, NaN, Sticky Imprecise, Sticky Overflow, Sticky Underflow, Sticky NaN. Example indicator values include Enabled or Disabled. Other indicators and/or values may be used.

In yet another embodiment with reference to FIG. 12B, a floating point control prefix instruction 1220 includes a floating point control prefix indicator 1222, and one or more floating point exception control indicators 1224. In this example, the indicator and value are combined into one field. Example control indicators may be Enable NaN, Disable Overflow, etc.

In yet a further embodiment with reference to FIG. 12C, a control prefix instruction 1230 includes a floating point control prefix indicator 1232, and a plurality of floating point exception fields 1234. Each field may be for a different exception (e.g., Imprecise, Overflow, Underflow, NaN, Sticky Imprecise, Sticky Overflow, Sticky Underflow, Sticky NaN), and a value, such as Enabled or Disabled is specified for each field.

In yet a further embodiment with reference to FIG. 12D, a floating point control prefix instruction 1240 includes a floating point control prefix indicator 1242; a plurality of masks fields 1244; and a plurality of floating point exception fields 1246. In this example, the mask field, when set to a particular value, such as one, indicates that the value of the exception field following the mask field is to be used, as opposed to the value in the control register.

Although various examples are provided, other implementations are possible.

One or more of the above examples of exception prefix instructions may be employed in the effective enablement embodiment described above. For instance, control prefix instruction 1200 may be used as follows: there may be two exception type indicators, with one bit each corresponding to "<whatever exception> prefix-enabled" and another for "<whatever exception prefix-disabled>; or there may be a FP Exception indicator for "whatever exception>" that has two bits. The latter would have less overhead in providing names for each of the bits.

In another example, control prefix instruction 1220 may be used, in which there may be "<whatever exception>_on", <whatever_exception>_off" and "<whatever exception_fp-scr>," each of which may yield a pair of two bits, e.g., disable/enable=11, 00, and 10, respectively.

In yet a further example, instruction 1230 may be used, in which there may be one field for "<whatever exception> prefix-enabled" and another for "<whatever exception prefix-disabled>"; or there may be a two-bit value, for "<whatever exception>", one bit corresponding to the enabled and another for the disabled. Many possibilities exist.

Figure 13:
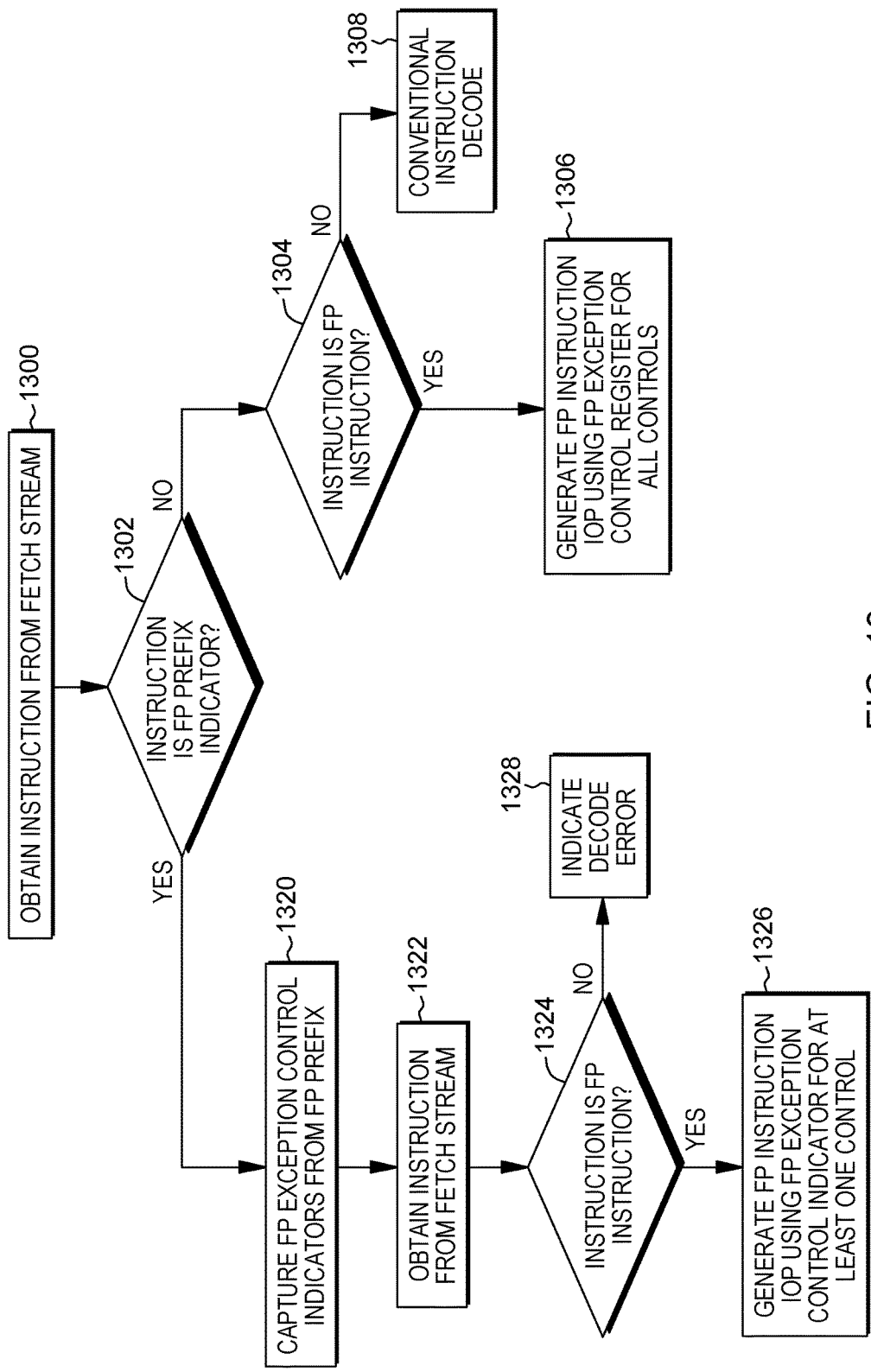
FIG. 13 depicts further details of using an exception prefix indicator, in accordance with an aspect of the present invention.

Further details regarding using the exception prefix indicator are described with reference to FIG. 13. In one example, it is the decode logic that performs this processing. Initially, an instruction is obtained from the fetched instruction stream, STEP 1300, and a determination is made as to whether the fetched instruction is a floating point prefix indicator instruction (e.g., based on the opcode or one or more other parameters), INQUIRY 1302. If it is not a prefix indicator instruction, then a further determination is made as to whether the instruction is a floating point instruction (e.g., based on the opcode or one or more other parameters), INQUIRY 1304. If it is a floating point instruction, then internal operations are generated for the floating point instruction using the floating point control register for the controls, STEP 1306. However, if the instruction is not a floating point instruction, then conventional instruction decode is performed, STEP 1308.

Returning to INQUIRY 1302, if the instruction is a floating point prefix indicator instruction, then, in one example, the floating point control indicators (e.g., exception and associated value (e.g., disable/enable)) are obtained from the prefix instruction, STEP 1320. Thereafter, another instruction (e.g., a next instruction) is obtained from the instruction stream, STEP 1322, and a determination is made as to whether the instruction is a floating point instruction, INQUIRY 1324. If the fetched instruction is a floating point instruction, then internal operations are generated for the fetched floating point instruction using the floating point control indicator for at least one control, STEP 1326. However, returning to INQUIRY 1324, if the instruction is not a floating point instruction, then a decode error is indicated, STEP 1328. As examples, based on indicating the decode error, error correction may be performed and this may include doing no error processing and processing the instruction that was fetched; raising an exception, or performing some other processing. Other possibilities exist.

In yet a further embodiment, a prefix may be provided that combines one or more control values, including rounding mode, exception suppression, and/or other values. Many variations are possible.

In yet further embodiments, an exception control mode can be placed in front of different types of floating point instructions, including decimal floating point instructions, hexadecimal floating point instructions, binary floating point instructions, and vector floating point instructions, as examples. The placing of an exception control mode prefix in front of a particular instruction modifies the exception mode used for executing that particular instruction. Other examples are also possible.

In accordance with yet a further aspect of the present invention, compiler controls may be provided for program regions (e.g., a sequence of instructions). Specifying such controls enables programmers to specify floating point controls to be used during code generation which may be translated directly into prefixes, in one embodiment. This enables compilers to generate code with floating point control and allotting point exception prefixes in accordance with aspects of the present invention. In accordance with another aspect of the present invention, a compiler may generate floating point control register updates for a processor where floating point control and floating point exception prefixes are not available. High level languages (e.g., computer languages other than assembly) have not previously offered a capability for specifying controls, such as rounding mode, etc., to an instruction sequence of a statically defined instruction range. Thus, in accordance with an aspect of the present invention, compiler controls are provided for program regions, such as an instruction sequence. In one embodiment, the control is associated with a section of the source code, and it may be delimited by indicators, providing a starting and end point.

For instance, a source level programming language specification may specify a range of code to use the round to nearest rounding mode, as follows:

```
#pragma BEGIN FP_CONTROL: NEAREST
Math(float a,b,c)
{
    return a*b+c;
}
#pragma END FP_CONTROL
```

In accordance with an aspect of the present invention, a compiler may generate the following code based on the above input:

```
Math:
    ROUND_NEAREST FM FRT, FRA, FRB
    ROUND_NEAREST FA FRES, FRT, FRC
    ...
```

In the above, the #pragma BEGIN and the #pragma END instructions delineate the section of code which is to use a particular floating point control, such as Round-to-Nearest, indicated by Nearest in the #pragma Begin instruction.

In another embodiment, the control may be associated with a higher level language construct, such as a function, method, loop, block, and so forth. One example of this is depicted below where the SET FP_CONTROL command is used to specify round to nearest rounding mode for the next function (the function called Math):

```
#pragma SET FP_CONTROL: NEAREST
Math(float a, b, c)
{
    return a*b+c;
}
```

In accordance with an aspect of the present invention, based on the above input, a compiler may generate:

```
Math:
    ROUND_NEAREST FM FRT, FRA, FRB
    ROUND_NEAREST FA FRES, FRT, FRC
    ...
```

Figure 14:
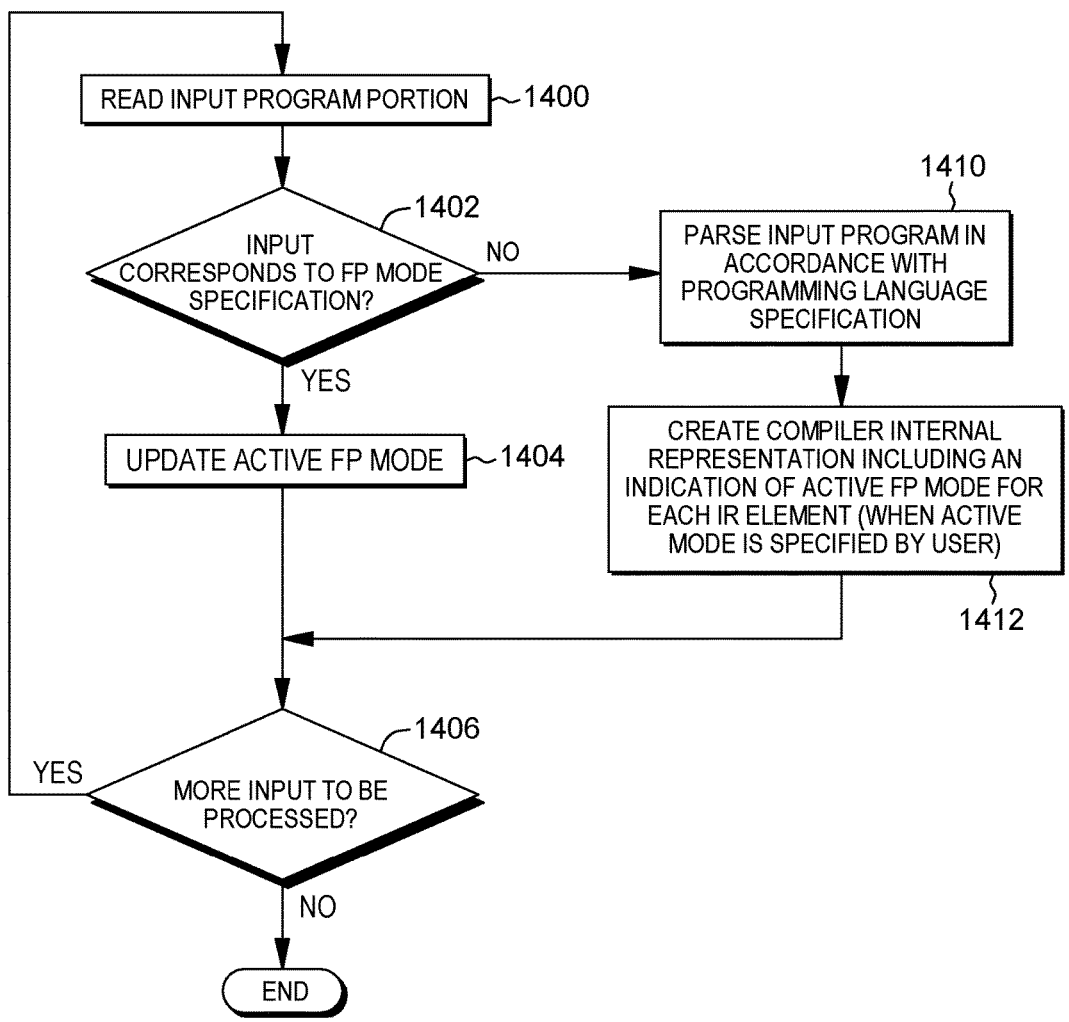
FIG. 14 depicts further details of using a floating point control associated with a program region, in accordance with an aspect of the present invention.

Further details relating to using such a control are described with reference to FIG. 14. In one example, it is the compiler performing this logic. Initially, an input program portion is read, STEP 1400. A determination is made as to whether that input corresponds to a floating point mode specification, INQUIRY 1402. That is, are there #pragma BEGIN/END instructions or a #pragma SET instruction for the sequence of code that has been input? If there is, then the active floating point mode is updated, STEP 1404. For instance, the rounding mode that is used is that specified on the #pragma instruction, instead of the control specified in the floating point control register. An example of updating the active floating point mode is described below. Thereafter, a determination is made as to whether there is more input to be processed, INQUIRY 1406. If so, processing continues with STEP 1400. Otherwise, processing is complete.

Returning to INQUIRY 1402, if the input does not correspond to a floating point mode specification, then the input program is parsed in accordance with a programming language specification, as in conventional processing, STEP 1410, and the compiler internal representation, including an indication of the active floating point mode for each internal representation element when an FP mode has been previously specified in accordance with STEP 1404, is created, STEP 1412. Processing then continues to INQUIRY 1406.

Figure 15:
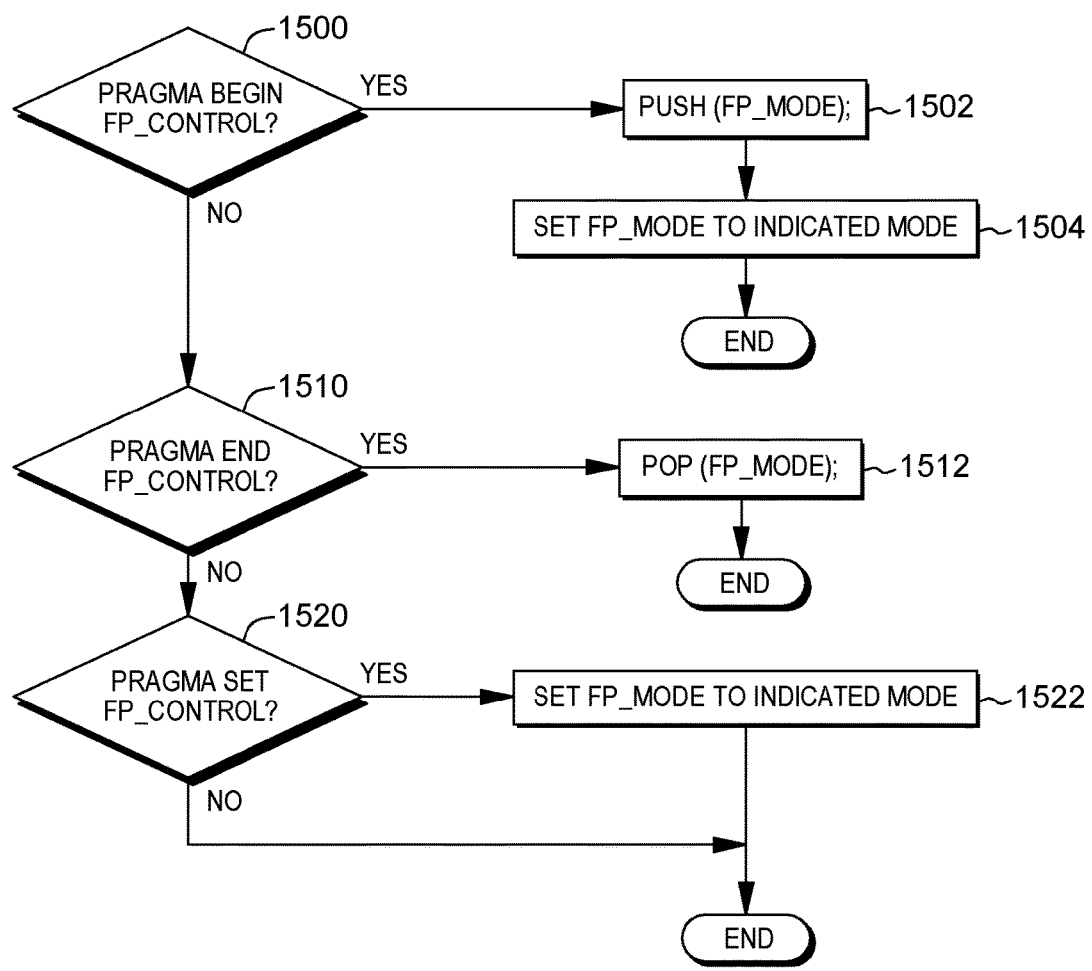
FIG. 15 depicts one embodiment of updating an active floating point mode, in accordance with an aspect of the present invention.

One example of updating the active floating point mode is described with reference to FIG. 15. Initially, a determination is made as to whether a pragma BEGIN floating point control is included in the code being examined, INQUIRY 1500. If so, then the current floating point mode (e.g., the value stored for the active FP mode, which is either an indication to use a specified mode, or to use a mode specified by the floating point control register) is pushed onto a FP mode processing stack (a stack maintained during the input reading process to track nested floating point control specifications), STEP 1502, and the active floating point mode (FP_mode) is set to the user-specified mode in the pragma instruction, STEP 1504. Returning to INQUIRY 1500, if a pragma BEGIN floating point control is not in the code being examined, then a determination is made as to whether a pragma END floating point control is included in the code being examined, INQUIRY 1510. If a pragma END instruction is included, then the floating point mode that was pushed onto the FP mode processing stack is popped from the stack, STEP 1512. Otherwise, retuning to INQUIRY 1510, if there is no pragma END control, then a further determination is made as to whether there is a pragma SET floating point control, INQUIRY 1520. If there is a pragma SET floating point control, then the floating point mode is set to the user-specified mode, STEP 1522. Otherwise, processing is complete. In a further embodiment, other types of inquiries may be made.

A further technique of using the user-specified controls in conjunction with one or more compiler optimization techniques is described with reference to FIG. 16. This logic is performed by, e.g., the compiler. In this example, internal representation (IR) elements of the code being examined are obtained, STEP 1600, and a determination is made as to whether optimization is possible, INQUIRY 1602. That is, does the compiler recognize an opportunity to optimize the code being examined? If not, then processing continues to determine if there are more elements to be processed, INQUIRY 1604. If so, processing continues with STEP 1600. Otherwise, processing is complete.

Returning to INQUIRY 1602, if optimization is possible, then a determination is made as to whether the user specified a floating point control mode (e.g., via a pragma delimiter), INQUIRY 1610. If not, then optimization is performed in accordance with conventional techniques, STEP 1612. For instance, a default rounding mode is used for constant folding (i.e., a process of recognizing and evaluating constant expressions at compile time, rather than computing them at runtime); and in another embodiment, no constant folding is performed as the rounding mode is determined at runtime. Other optimizations are also possible.

Returning to INQUIRY 1610, if the user specified a floating point control mode, then optimization is performed in accordance with the user-specified floating point control mode, STEP 1614. For example, the user-specified rounding mode is used for the constant folding. Other optimizations are also possible. Thereafter, processing continues to INQUIRY 1604.

Figure 16:
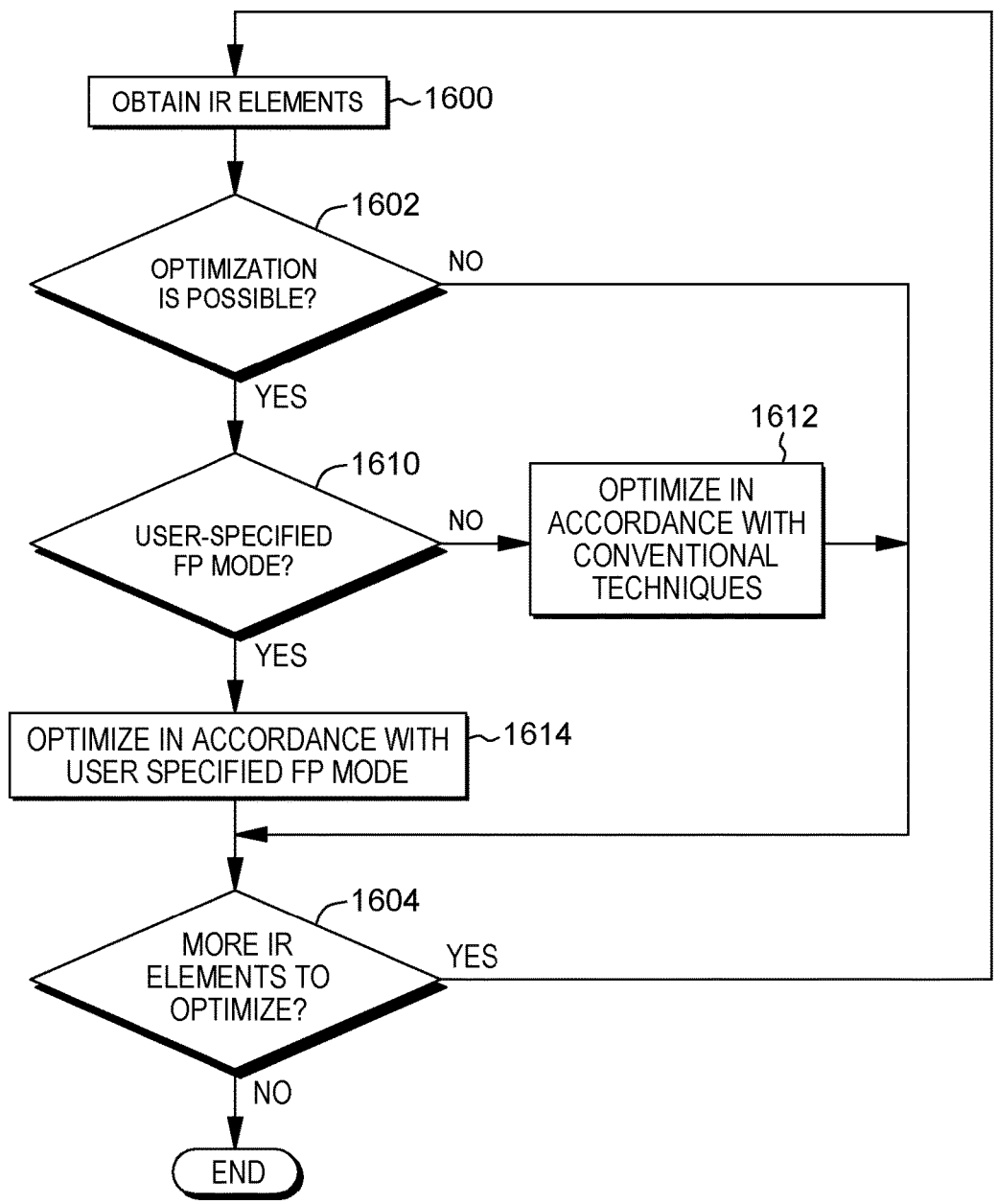
FIG. 16 depicts one technique of using user-specified floating point controls with optimization, in accordance with an aspect of the present invention.

A variety of optimization techniques may be performed in conjunction with the techniques of FIG. 16. One example of an optimization being performed is constant folding. Constant folding refers to an optimization that combines constants known at compile time. In accordance with an aspect of the present invention, for decimal arithmetic (and rounding at the full digit value for the purpose of this example), when constant folding is performed on the expression "1+1.3", when the active FP rounding mode with an aspect of the present invention is round to nearest, or round down, or round towards zero, the example expression will be replaced by the constant "2". When the active FP rounding mode is "up" or "away from zero", the example expression will be replaced by the value "3". In one embodiment, when no active FP mode is specified, a compiler may choose round to nearest, in accordance with convention. In another embodiment, a compiler may not perform constant folding, in accordance with convention, so as to perform the operation at runtime with the runtime-specified rounding value.

Figure 17:
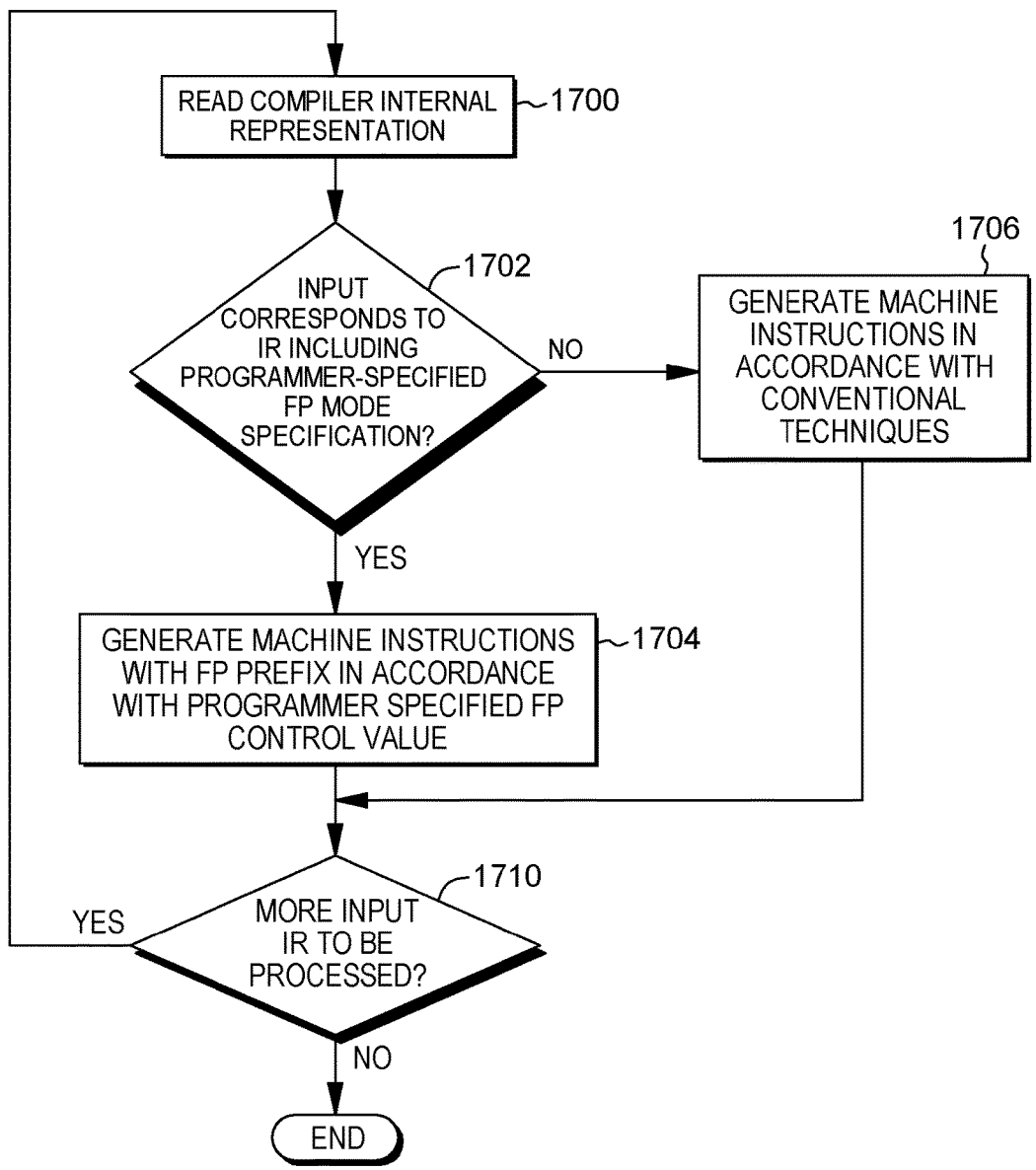
FIG. 17 depicts one embodiment of generating machine instructions with floating point prefixes, in accordance with an aspect of the present invention.

In yet a further aspect of the present invention, the compiler performs a code generation step and converts the internal representations into assembler code, as described with reference to FIG. 17. Assembler code may correspond to either assembler source code, object code, or another representation. In this example, the compiler internal representation is read, STEP 1700, and a determination is made as to whether the input corresponds to an internal representation that includes a programmer-specified floating point control mode specification, INQUIRY 1702. If so, then machine instructions are generated with a floating point prefix (described above) in accordance with the programmer-specified floating point control value, STEP 1704. Otherwise, if the input does not correspond to an internal representation that includes a programmer-specified floating point control mode specification, then machine instructions are generated in accordance with conventional techniques, STEP 1706. Subsequent to generating machine instructions, a determination is made as to whether there is more input to be processed, INQUIRY 1710. If there is more input to be processed, then processing continues with STEP 1700. Otherwise, processing is complete, and the generated instructions may be executed.

In one embodiment, the different compiler techniques may be nested. In yet a further embodiment, there is provided at least one compiler technique directed at reading source code, parsing the code, and translating the parsed code into an abstract syntax tree (AST) or a register level set of instructions (RTXs), both commonly reflective of different types of internal representations or internal language of a compiler.

In a further embodiment, the internal representations may be used and constant folding and other optimizations may be adapted in view of the expressed rounding mode (or other control) intent. Further, in another embodiment, there is provided a code generation technique generating code with prefixes, in accordance with an aspect of the invention.

In yet a further aspect, an instruction that associates a control, such as rounding mode, is indicated to a source language element in a high level language, and code parsing, code transformation, optimization and generation techniques therefor are provided.

In accordance with a further aspect of the present invention, there are provided compiler controls for program blocks. In one embodiment, the control is associated with an expression, a block, a loop, a line or other element of the source code, and may be delineated by delimiters providing a starting and end point. In another embodiment, the program block may correspond to a function or a subroutine.

One example of a compiler control for code generation with predictable floating point state for a source line is as follows:

```
Math(float a,b,c)
{
#pragma FP_CONTROL: NEAREST
float tmp = a*b;
#pragma FP_CONTROL: UP
    return tmp+c;
}
```

Based on the example input specification above, a compiler may generate the following assembler code:

```
Math:
    ROUND_NEAREST FM FRT, FRA, FRB
    ROUND_UP, RECORD_ILLEGAL, RECORD_INFINITY FA FRES, FRT, FRC
...
```

In another embodiment, the control may be associated with a high level language construct, such as an expression, loop, block, and so forth, as indicated in the following example:

```
Math(float a,b,c)
{
#pragma EXPRESSION FP_ CONTROL: NEAREST
    return a*b+c;
}
```

Based on the example input specification above, a compiler may generate the following assembler code:

```
Math:
    ROUND_NEAREST FM FRT, FRA, FRB
    ROUND_NEAREST FA FRES, FRT, FRC
...
```

In yet another embodiment, the control may be associated with a high level language construct, such as a function, method, loop, block and so forth, as indicated in the following example, e.g.:

```
#pragma FUNCTION FP_CONTROL: NEAREST
-or-
#pragma FP_CONTROL: NEAREST
Math(float a,b,c)
{
    return a*b+c;
}
```

Based on the example input specification above, a compiler may generate the following assembler code:

```
Math:
    ROUND_NEAREST FM FRT, FRA, FRB
    ROUND_NEAREST FA FRES, FRT, FRC
...
```

In the particular example of #pragma FP_control, the compiler infers the next program structure to apply the floating point control to; in the above example, the next block is a function.

In another aspect of a block specification, the scope (FUNCTION) is explicitly specified using #pragma FUNCTION FP_CONTROL.

In a further example, the compiler infers the next program structure to apply the floating point control to (see #pragma FP_control); in the below example, the next block is a loop:

```
float
test(float a[ ])
{
    float sum = 0.0;
#pragma LOOP FP_CONTROL: NEAREST
-or-
#pragma FP_CONTROL: NEAREST
```

```
            for (int i=0; i<MAX;i++)
                sum +]a[i];
            return sum;
        }
```

In the particular example of #pragma FP_control, the compiler infers the next program structure to apply the floating point control to; in the above example, the next block is a loop.

In another aspect of a block specification, the scope (LOOP) is explicitly specified using #pragma LOOP FP_CONTROL.

In yet another embodiment, the compiler infers the next program structure to apply the floating point control to (see, e.g., #pragma FP_control); in the below example, the next block is a block, i.e., a group of statements grouped by parenthesis:

```
        float
        test(float a[ ])
        {
            float sum = 0.0;
        #pragma BLOCK FP_CONTROL: NEAREST
        -or-
        #pragma FP_CONTROL: NEAREST
            {
                sum = a[0];
                sum += a[1];
                sum += a[2];
            }
            return sum;
        }
```

In the particular example of #pragma FP_control, the compiler infers the next program structure to apply the floating point control to; in the above example, the next block is a block.

In another aspect of a block specification, the scope (BLOCK) is explicitly specified using #pragma BLOCK FP_CONTROL.

Figure 18:
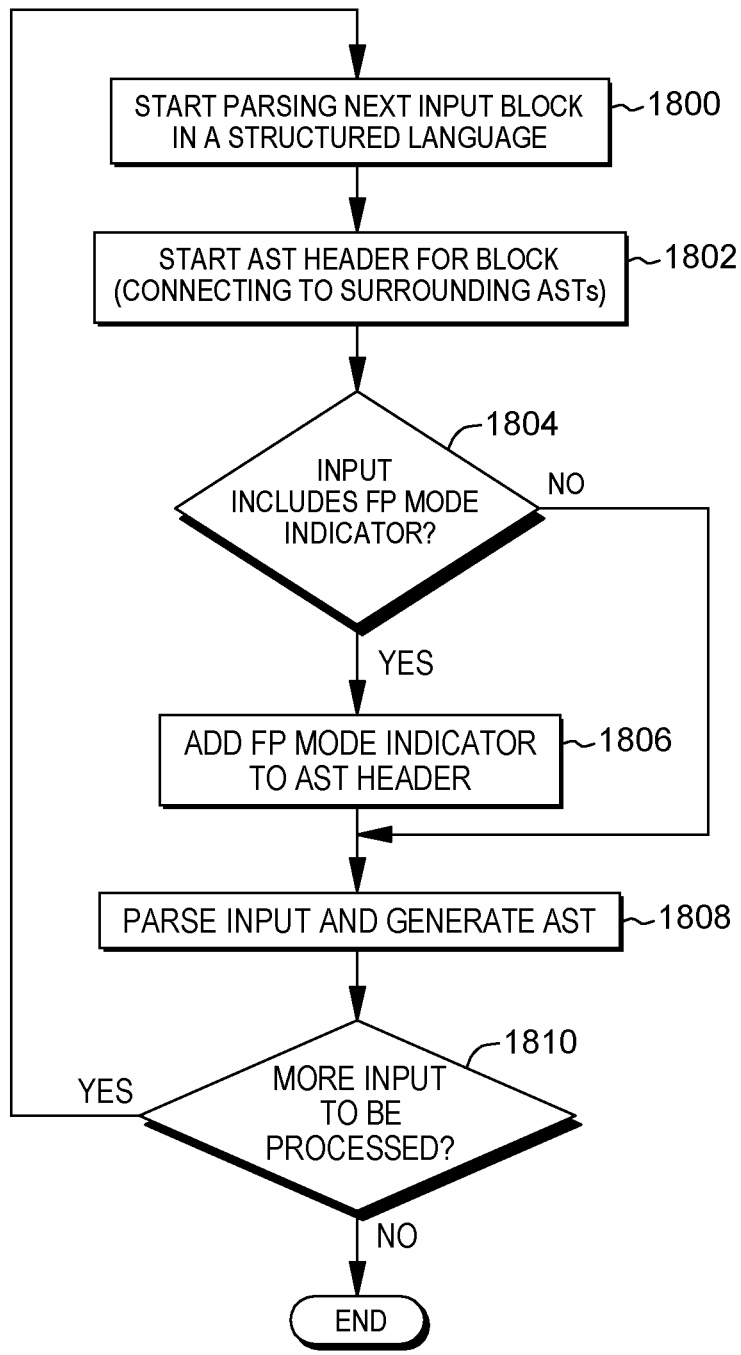
FIG. 18 depicts one aspect of a compiler technique to perform processing associated with floating point mode indicators, in accordance with an aspect of the present invention.

Further details of one aspect of a compiler technique to perform processing is described with reference to FIG. 18. Initially, the compiler starts parsing an input block of a structured language, STEP 1800. An AST (Abstract Syntax Tree) header is started for the block (connecting to surrounding ASTs), STEP 1802. A determination is made as to whether the input includes a user-specified floating point mode indicator (e.g., a #pragma instruction), INQUIRY 1804. If so, then the floating point mode control indicator is added to the AST header, STEP 1806. Thereafter, or if the input does not include a floating point mode control indicator, then the input is parsed and an AST is generated (as in conventional processing), STEP 1808. Thereafter, a determination is made as to whether there is more input to be processed, INQUIRY 1810. If there is more input to be processed, then processing continues with STEP 1800. Otherwise, processing is complete.

Figure 19:
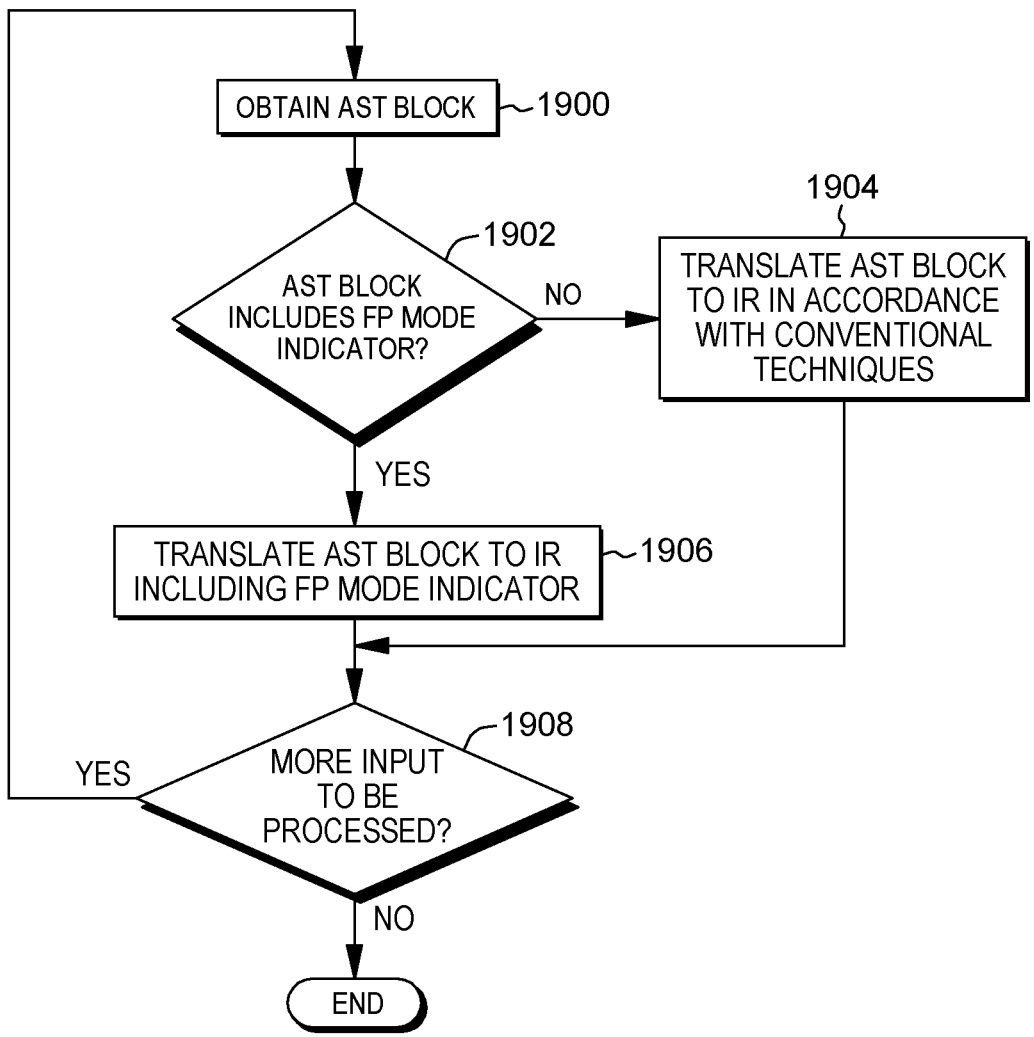
FIG. 19 depicts a further embodiment of a compiler technique to perform processing associated with floating point mode indicators, in accordance with an aspect of the present invention.

A further aspect of the present invention relates to converting ASTs including FP mode specification to IRs with FP mode specification and is described with reference to FIG. 19. In this embodiment, an AST block is obtained, STEP 1900, and a determination is made as to whether the AST block includes a floating point mode control indicator (e.g., based on a #pragma instruction), INQUIRY 1902. If it does not include a floating point mode control indicator, then the AST block is translated to an internal representation in accordance with conventional techniques, STEP 1904. However, if the AST block includes a floating point mode control indicator, then the AST block is translated to an internal representation that includes the floating point mode indicator, STEP 1906. In one example, an AST block is translated to an IR using a compiler that performs such translation, such as the Low Level Virtual Machine (LLVM) compiler or another such compiler. The compiler performs code generation that recursively walks an AST and emits an IR into a module. After translating the AST block to internal representation in either STEP 1904 or 1906, a determination is made as to whether there is more input to be processed, INQUIRY 1908. If there is more input to be processed, then processing continues with STEP 1900. Otherwise, processing is complete.

In at least one embodiment, one or more of these aspects may be nested.

As described herein, there may be at least one compiler technique directed at reading source code, parsing code, translating parsed code to an abstract syntax tree (AST) or a register level set of expressions (RTXs), both commonly reflective of different types of IR or IL (internal representation or internal language) of a compiler.

The annotation of the pragma or such in the IR indicates static rounding modes. Further, there is provided a capability for using the IR and adapting constant folding and other optimizations in view of the expressed rounding mode intent.

Furthermore, there is provided a code generation technique to generate code with prefixes, in accordance with one or more aspects.

Described herein are various aspects and embodiments of floating point control processing. Although a number of examples and techniques are provided, variations and/or additions may be made without departing from a spirit of aspects of the present invention. One or more aspects may be combined with one or more other aspects.

One or more aspects of the present invention are inextricably tied to computer technology and facilitate processing within a computer, improving performance thereof. Further details of one embodiment of facilitating processing within a computing environment, as it relates to one or more aspects of the present invention, are described with reference to FIGS. 20A-20B.

Figure 20A:
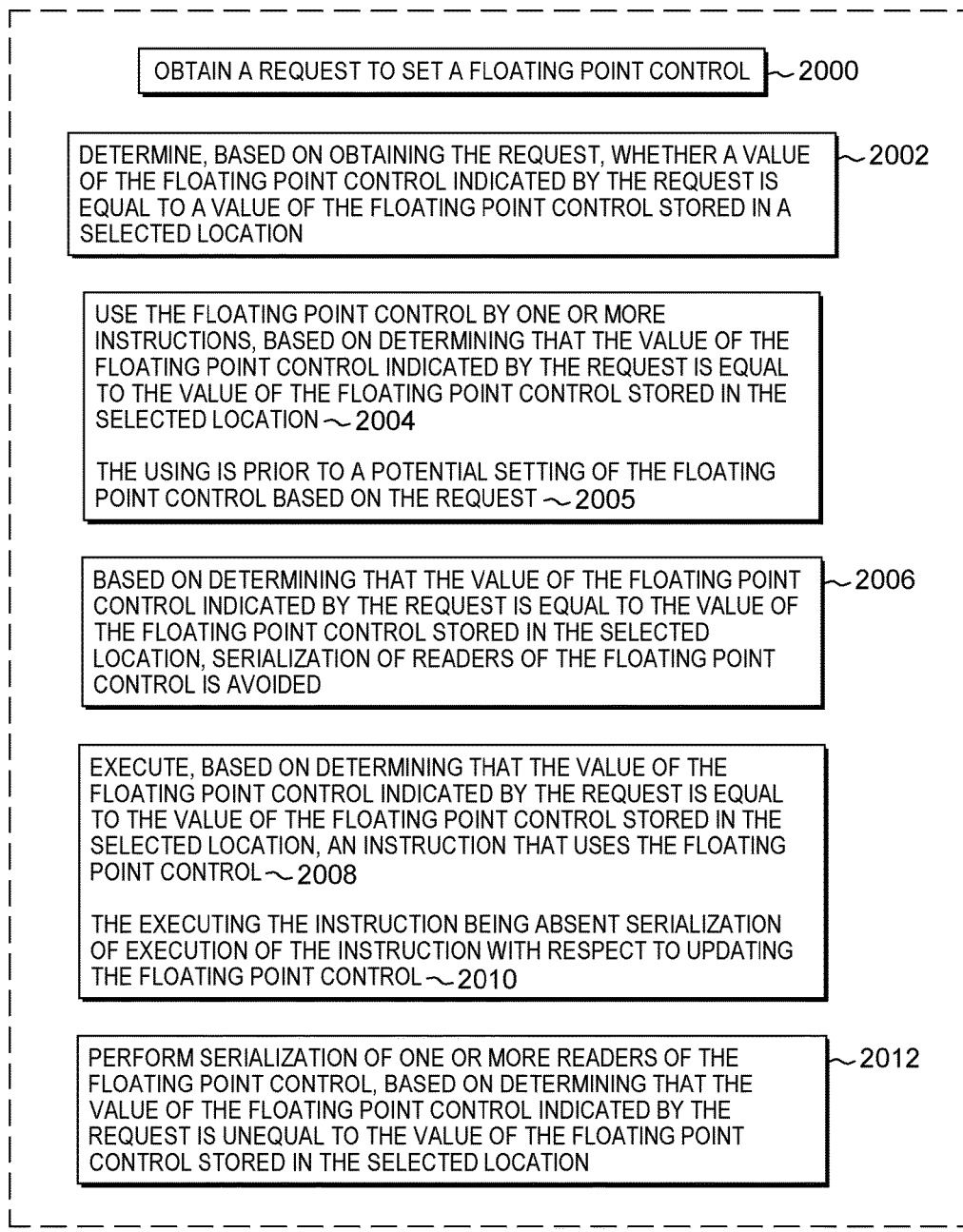
FIGS. 20A-20B depict one embodiment of facilitating processing in a computing environment, in accordance with an aspect of the present invention.

Referring to FIG. 20A, in one embodiment, a request to set a floating point control is obtained (2000). Based on obtaining the request, a determination is made as to whether a value of the floating point control indicated by the request is equal to a value of the floating point control stored in a selected location (2002). Based on determining that the value of the floating point control indicated by the request is equal to the value of the floating point control stored in the selected location, the floating point control is used by one or more instructions (2004). The using is prior to a potential setting of the floating point control based on the request (2005). For instance, the one or more instructions use the floating point control regardless of whether the floating point control is set based on the request. The one or more instructions may use the floating point control prior to or without setting the floating point control. Serialization of the one or more instructions with respect to setting the floating point control is not needed.

In one example, based on determining that the value of the floating point control indicated by the request is equal to the value of the floating point control stored in the selected location, serialization of readers of the floating point control is avoided (2006). Further, in one example, based on determining that the value of the floating point control indicated by the request is equal to the value of the floating point control stored in the selected location, an instruction that uses the floating point control is executed (2008). The execution of the instruction is absent serialization of execution of the instruction with respect to updating the floating point control (2010).

In a further example, based on determining that the value of the floating point control indicated by the request is unequal to the value of the floating point control stored in the selected location, serialization of one or more readers of the floating point control is performed (2012).

Figure 20B:
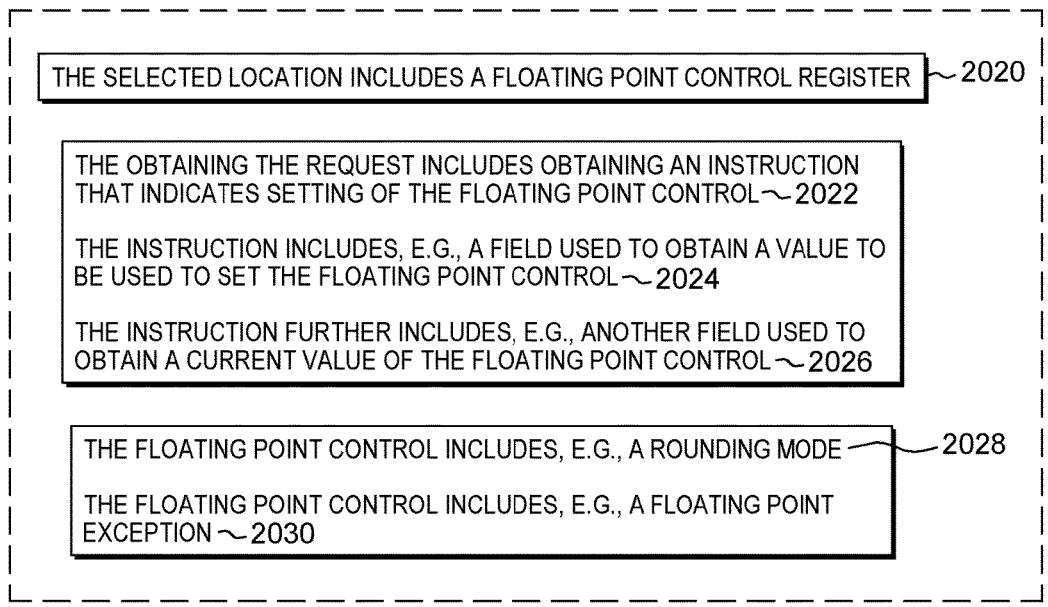

Referring to FIG. 20B, in one example, the selected location includes a floating point control register (2020).

In one example, the obtaining the request includes obtaining an instruction that indicates setting of the floating point control (2022). The instruction includes, e.g., a field used to obtain a value to be used to set the floating point control (2024). The instruction further includes, e.g., another field used to obtain a current value of the floating point control (2026).

As examples, the floating point control may include a rounding mode (2028), or a floating point exception (2030). Other examples are also possible.

In accordance with one or more aspects of the present invention, efficiencies and/or optimizations are provided for managing floating point controls. These efficiencies/optimizations facilitate processing within a computing environment, thereby enhancing performance and/or reducing costs.

Many variations are possible without departing from a spirit of aspects of the present invention. It should be noted that numerous aspects and features are described herein, and unless otherwise inconsistent, each aspect or feature may be combinable with any other aspect or feature.

Figure 21A:
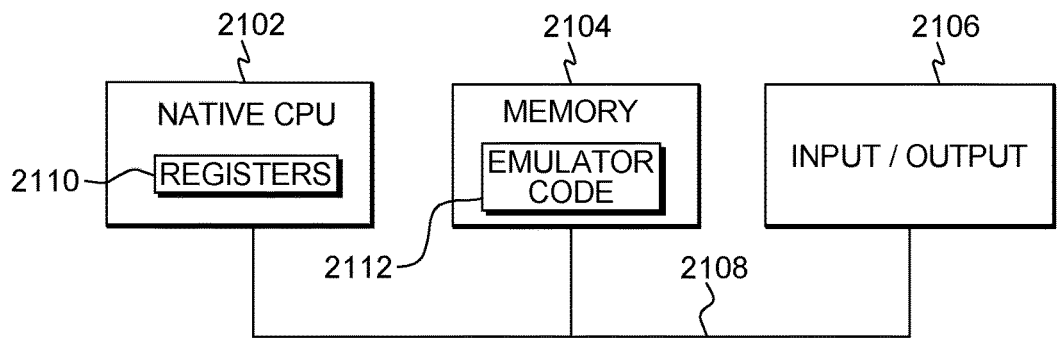
FIG. 21A depicts another example of a computing environment to incorporate and use one or more aspects of the present invention.

Other types of computing environments may also incorporate and use one or more aspects of the present invention, including, but not limited to, emulation environments, an example of which is described with reference to FIG. 21A. In this example, a computing environment 2100 includes, for instance, a native central processing unit (CPU) 2102, a memory 2104, and one or more input/output devices and/or interfaces 2106 coupled to one another via, for example, one or more buses 2108 and/or other connections. As examples, computing environment 2100 may include a PowerPC processor or a pSeries server offered by International Business Machines Corporation, Armonk, N.Y.; and/or other machines based on architectures offered by International Business Machines Corporation, Intel, or other companies.

Native central processing unit 2102 includes one or more native registers 2110, such as one or more general purpose registers and/or one or more special purpose registers used during processing within the environment. These registers include information that represents the state of the environment at any particular point in time.

Moreover, native central processing unit 2102 executes instructions and code that are stored in memory 2104. In one particular example, the central processing unit executes emulator code 2112 stored in memory 2104. This code enables the computing environment configured in one architecture to emulate another architecture. For instance, emulator code 2112 allows machines based on architectures other than the z/Architecture, such as PowerPC processors, pSeries servers, or other servers or processors, to emulate the z/Architecture and to execute software and instructions developed based on the z/Architecture.

Figure 21B:
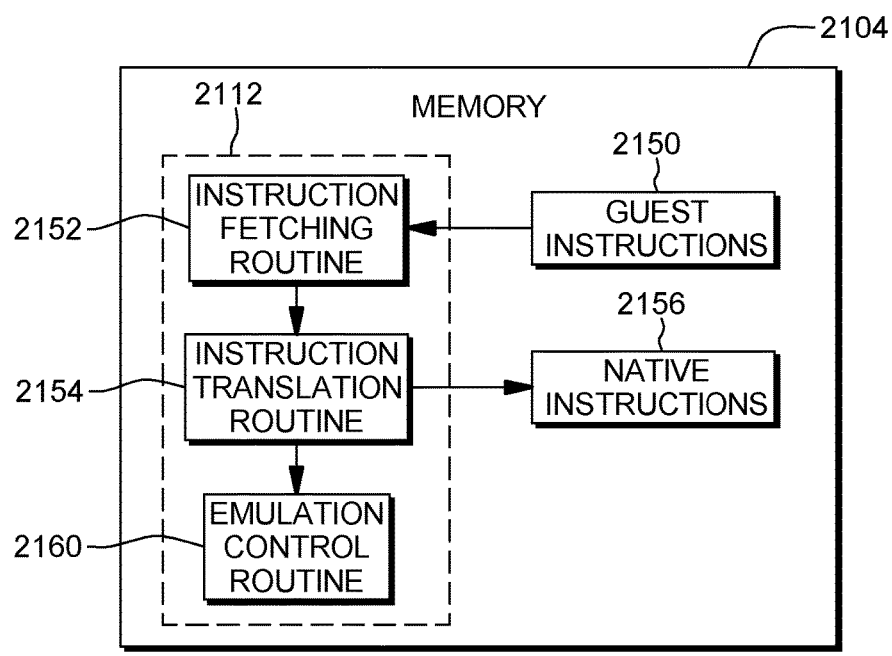
FIG. 21B depicts further details of the memory of FIG. 21A.

Further details relating to emulator code 2112 are described with reference to FIG. 21B. Guest instructions 2150 stored in memory 2104 comprise software instructions (e.g., correlating to machine instructions) that were developed to be executed in an architecture other than that of native CPU 2102. For example, guest instructions 2150 may have been designed to execute on a z/Architecture processor, but instead, are being emulated on native CPU 2102, which may be, for example, an Intel processor. In one example, emulator code 2112 includes an instruction fetching routine 2152 to obtain one or more guest instructions 2150 from memory 2104, and to optionally provide local buffering for the instructions obtained. It also includes an instruction translation routine 2154 to determine the type of guest instruction that has been obtained and to translate the guest instruction into one or more corresponding native instructions 2156. This translation includes, for instance, identifying the function to be performed by the guest instruction and choosing the native instruction(s) to perform that function.

Further, emulator code 2112 includes an emulation control routine 2160 to cause the native instructions to be executed. Emulation control routine 2160 may cause native CPU 2102 to execute a routine of native instructions that emulate one or more previously obtained guest instructions and, at the conclusion of such execution, return control to the instruction fetch routine to emulate the obtaining of the next guest instruction or a group of guest instructions. Execution of native instructions 2156 may include loading data into a register from memory 2104; storing data back to memory from a register; or performing some type of arithmetic or logic operation, as determined by the translation routine.

Each routine is, for instance, implemented in software, which is stored in memory and executed by native central processing unit 2102. In other examples, one or more of the routines or operations are implemented in firmware, hardware, software or some combination thereof. The registers of the emulated processor may be emulated using registers 2110 of the native CPU or by using locations in memory 2104. In embodiments, guest instructions 2150, native instructions 2156 and emulator code 2112 may reside in the same memory or may be disbursed among different memory devices.

As used herein, firmware includes, e.g., the microcode or Millicode of the processor. It includes, for instance, the hardware-level instructions and/or data structures used in implementation of higher level machine code. In one embodiment, it includes, for instance, proprietary code that is typically delivered as microcode that includes trusted software or microcode specific to the underlying hardware and controls operating system access to the system hardware.

A guest instruction 2150 that is obtained, translated and executed may be, for instance, one of the instructions described herein. The instruction, which is of one architecture (e.g., the z/Architecture), is fetched from memory, translated and represented as a sequence of native instructions 2156 of another architecture (e.g., PowerPC, pSeries, Intel, etc.). These native instructions are then executed.

One or more aspects may relate to cloud computing.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for loadbalancing between clouds).

A cloud computing environment is service oriented with a focus on statelessness, low coupling, modularity, and semantic interoperability. At the heart of cloud computing is an infrastructure comprising a network of interconnected nodes.

Figure 22:
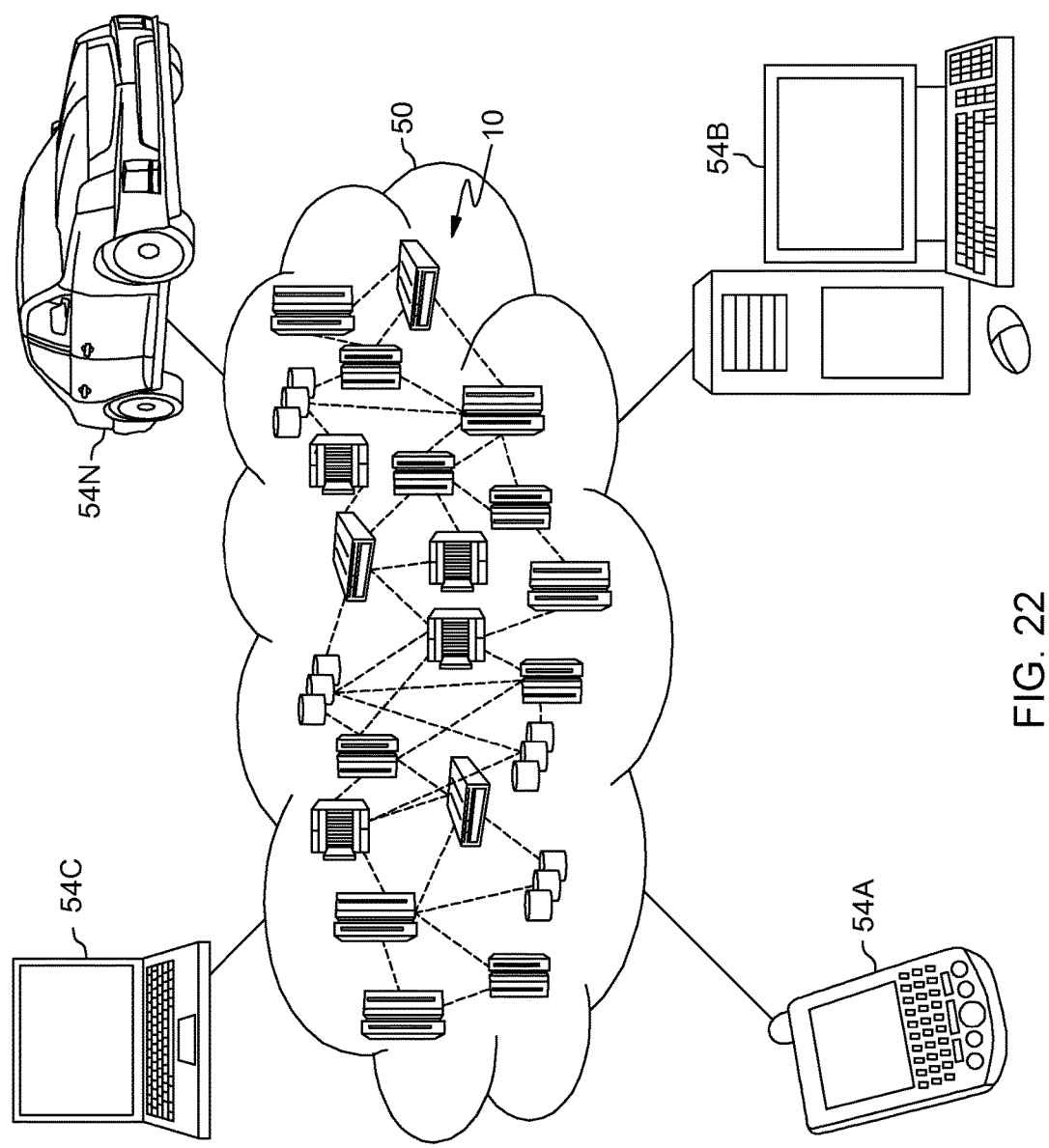
FIG. 22 depicts one embodiment of a cloud computing environment.

Referring now to FIG. 22, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 22 are intended to be illustrative only and that computing nodes 10 and cloud computing environment 50 can communicate with any type of computerized device over any type of network and/or network addressable connection (e.g., using a web browser).

Figure 23:
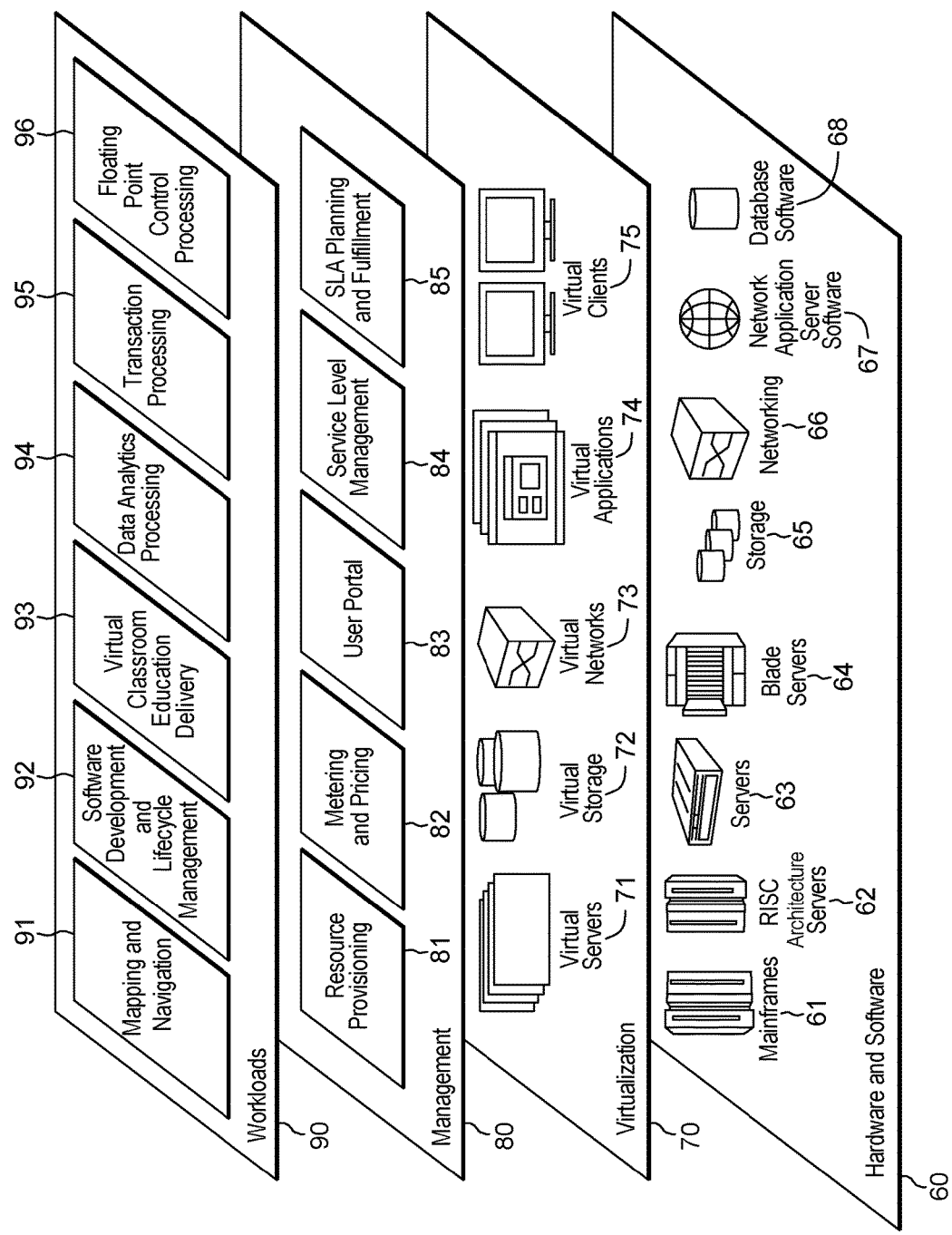
FIG. 23 depicts one example of abstraction model layers.

Referring now to FIG. 23, a set of functional abstraction layers provided by cloud computing environment 50 (FIG. 22) is shown. It should be understood in advance that the components, layers, and functions shown in FIG. 23 are intended to be illustrative only and embodiments of the invention are not limited thereto. As depicted, the following layers and corresponding functions are provided:

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and floating point (FP) control processing 96.

One or more aspects of the present invention are inextricably tied to computer technology and facilitate processing within a computer, improving performance thereof.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions, instruction formats, instruction fields and/or instruction values may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer program product for facilitating processing within a computing environment, the computer program product comprising:
  a non-transitory computer readable storage medium readable by a processing circuit and storing instructions for performing a method comprising:
    obtaining a set floating point control instruction to set a floating point control to a value indicated by the instruction, the floating point control located in a register; and
    executing the set floating point control instruction, the executing including:
      determining whether the value of the floating point control indicated by the set floating point control instruction is equal to a current value of the floating point control; and
      based on determining that the value of the floating point control indicated by the set floating point control instruction is equal to the current value of the floating point control, using the current value of the floating point control by one or more instructions to perform one or more floating point operations, wherein based on determining that the value of the floating point control indicated by the set floating point control instruction is equal to the current value of the floating point control, execution of the set floating point control instruction is ended absent performing the set of the floating point control specified by the set floating point control instruction and avoiding a renaming of the register in which the floating point control is located.

2. The computer program product of claim 1, wherein based on determining that the value of the floating point control indicated by the set floating point control instruction is equal to the current value of the floating point control, serialization of readers of the floating point control is avoided.

3. The computer program product of claim 1, wherein the method further comprises executing, based on determining that the value of the floating point control indicated by the set floating point control instruction is equal to the current value of the floating point control, an instruction that uses the floating point control, the executing the instruction being absent serialization of execution of the instruction with respect to updating the floating point control.

4. The computer program product of claim 1, wherein the method further comprises performing serialization of one or more readers of the floating point control, based on determining that the value of the floating point control indicated by the set floating point control instruction is unequal to the current value of the floating point control.

5. The computer program product of claim 1, wherein the register comprises a floating point control register.

6. The computer program product of claim 1, wherein the set floating point control instruction comprises an operation code field including an operation code indicating a set operation, a target operand field indicating a location to include the current value, and a source operand field used to indicate the value.

7. The computer program product of claim 1, wherein the set floating point control instruction includes a field used to obtain the value to be used to set the floating point control.

8. The computer program product of claim 7, wherein the set floating point control instruction further includes another field used to obtain the current value of the floating point control.

9. The computer program product of claim 1, wherein the floating point control comprises a rounding mode.

10. The computer program product of claim 1, wherein the floating point control comprises a floating point exception.

11. A computer system for facilitating processing within a computing environment, the computer system comprising:
a memory; and
a processor in communication with the memory, wherein the computer system is configured to perform a method, said method comprising:
obtaining a set floating point control instruction to set a floating point control to a value indicated by the instruction, the floating point control located in a register; and
executing the set floating point control instruction, the executing including:
determining whether the value of the floating point control indicated by the set floating point control instruction is equal to a current value of the floating point control; and
based on determining that the value of the floating point control indicated by the set floating point control instruction is equal to the current value of the floating point control, using the current value of the floating point control by one or more instructions to perform one or more floating point operations, wherein based on determining that the value of the floating point control indicated by the set floating point control instruction is equal to the current value of the floating point control, execution of the set floating point control instruction is ended absent performing the set of the floating point control specified by the set floating point control instruction and avoiding a renaming of the register in which the floating point control is located.

12. The computer system of claim 11, wherein based on determining that the value of the floating point control indicated by the set floating point control instruction is equal to the current value of the floating point control, serialization of readers of the floating point control is avoided.

13. The computer system of claim 11, wherein the method further comprises executing, based on determining that the value of the floating point control indicated by the set floating point control instruction is equal to the current value of the floating point control, an instruction that uses the floating point control, the executing the instruction being absent serialization of execution of the instruction with respect to updating the floating point control.

14. The computer system of claim 11, wherein the method further comprises performing serialization of one or more readers of the floating point control, based on determining that the value of the floating point control indicated by the set floating point control instruction is unequal to the current value of the floating point control.

15. The computer system of claim 11, wherein the register comprises a floating point control register.

16. A computer-implemented method of facilitating processing within a computing environment, the computer-implemented method comprising:
obtaining, by a processor, a set floating point control instruction to set a floating point control to a value indicated by the instruction, the floating point control located in a register; and
executing the set floating point control instruction, the executing including:
determining whether the value of the floating point control indicated by the set floating point control instruction is equal to a current value of the floating point control; and
based on determining that the value of the floating point control indicated by the set floating point control instruction is equal to the current value to the floating point control, using the current value of the floating point control by one or more instructions to perform one or more floating point operations, wherein based on determining that the value of the floating point control indicated by the set floating point control instruction is equal to the current value of the floating point control, execution of the set floating point control instruction is ended absent performing the set of the floating point control specified by the set floating point control instruction and avoiding a renaming of the register in which the floating point control is located.

17. The computer-implemented method of claim 16, wherein based on determining that the value of the floating point control indicated by the set floating point control instruction is equal to the current value of the floating point control, serialization of readers of the floating point control is avoided.

18. The computer-implemented method of claim 16, further comprising executing, based on determining that the value of the floating point control indicated by the set floating point control instruction is equal to the current value of the floating point control, an instruction that uses the floating point control, the executing the instruction being absent serialization of execution of the instruction with respect to updating the floating point control.

19. The computer-implemented method of claim 16, further comprising performing serialization of one or more readers of the floating point control, based on determining that the value of the floating point control indicated by the set floating point control instruction is unequal to the current value of the floating point control.

20. The computer-implemented method of claim 16, wherein the register comprises a floating point control register.

* * * * *